United States Patent
Sakakibara

(10) Patent No.: US 12,514,069 B2
(45) Date of Patent: Dec. 30, 2025

(54) DISPLAY DEVICE HAVING REDUCED TINT DIFFERENCE IN DISPLAY SURFACE BETWEEN DIFFERENT VIEW ANGLES

(71) Applicant: SHARP KABUSHIKI KAISHA, Sakai (JP)

(72) Inventor: Yusuke Sakakibara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 441 days.

(21) Appl. No.: 18/013,846

(22) PCT Filed: Jul. 6, 2020

(86) PCT No.: PCT/JP2020/026358
§ 371 (c)(1),
(2) Date: Dec. 29, 2022

(87) PCT Pub. No.: WO2022/009257
PCT Pub. Date: Jan. 13, 2022

(65) Prior Publication Data
US 2023/0180532 A1    Jun. 8, 2023

(51) Int. Cl.
*H10K 59/122*    (2023.01)
*H10K 50/10*    (2023.01)
*H10K 59/00*    (2023.01)
*H10K 59/35*    (2023.01)
*H10K 59/80*    (2023.01)

(52) U.S. Cl.
CPC ....... *H10K 59/122* (2023.02); *H10K 59/8792* (2023.02); *H10K 50/10* (2023.02); *H10K 59/00* (2023.02); *H10K 59/352* (2023.02)

(58) Field of Classification Search
CPC ............ H10K 59/122; H10K 59/8792; H10K 59/352; H10K 59/353; H10K 2102/3023
See application file for complete search history.

(56) References Cited

U.S. PATENT DOCUMENTS

| | | |
|---|---|---|
| 2011/0043096 A1 | 2/2011 | Asaki |
| 2014/0048779 A1 | 2/2014 | Lee et al. |

(Continued)

FOREIGN PATENT DOCUMENTS

| | | |
|---|---|---|
| JP | 2011040352 A | 2/2011 |
| JP | 2012054091 A | 3/2012 |

(Continued)

*Primary Examiner* — Nduka E Ojeh
(74) *Attorney, Agent, or Firm* — ScienBiziP, P.C.

(57) ABSTRACT

A display device includes a plurality of light-emitting layers each capable of emitting light in a reference direction orthogonal to a light-emitting surface, and a light-blocking portion capable of blocking part of light traveling from the light-emitting surface in directions inclined with respect to the reference direction. The plurality of light-emitting layers include a first light-emitting layer capable of emitting light with a first peak wavelength and a second light-emitting layer capable of emitting light with a second peak wavelength that is longer than the first peak wavelength. The first light-emitting layer has, compared with the second light-emitting layer, a large ratio of the part of light that can be blocked by the light-blocking portion to light traveling in at least one certain direction out of the inclined directions.

13 Claims, 53 Drawing Sheets

(56) References Cited

U.S. PATENT DOCUMENTS

| | | | | |
|---|---|---|---|---|
| 2015/0221710 A1* | 8/2015 | Motoyama | ........... | H10K 59/353 |
| | | | | 257/89 |
| 2019/0157364 A1* | 5/2019 | Yan | ...................... | H10K 59/173 |
| 2020/0013839 A1* | 1/2020 | Tanaka | ................. | H10K 59/124 |
| 2020/0041099 A1* | 2/2020 | Fukuda | .................. | H10K 59/35 |
| 2020/0212113 A1* | 7/2020 | Song | .................... | H10K 59/122 |
| 2020/0395416 A1* | 12/2020 | Bae | ........................ | H10K 59/38 |
| 2021/0367011 A1* | 11/2021 | Bing | ..................... | H10K 59/35 |
| 2021/0384274 A1* | 12/2021 | Ahn | ..................... | H10K 59/122 |

FOREIGN PATENT DOCUMENTS

| | | | |
|---|---|---|---|
| JP | 2012221811 | A | 11/2012 |
| JP | 2015146304 | A | 8/2015 |
| JP | 2019204793 | A | 11/2019 |
| JP | 2020017349 | A | 1/2020 |
| JP | 2020021619 | A | 2/2020 |

\* cited by examiner

DISPLAY DEVICE HAVING REDUCED TINT DIFFERENCE IN DISPLAY SURFACE BETWEEN DIFFERENT VIEW ANGLES

TECHNICAL FIELD

The disclosure relates to a display device.

BACKGROUND ART

The development of a display device including quantum dot light-emitting diodes (QLEDs), organic light-emitting diodes (OLEDs), or the like having a thin film layered structure has been advancing.

SUMMARY

Technical Problem

In the display device described in JP 2019-204793 A, for example, two light beams emitted from a light-emitting layer interfere with each other. More specifically, interference occurs between a first light beam directly radiated to the outside from the light-emitting layer and a second light beam radiated to the outside after the first light beam emitted from the light-emitting layer reflects on an electrode. Accordingly, the intensity of light emitted from the light-emitting layer varies depending on an optical path difference between the first light beam and the second light beam. Thus, the intensity of light visible to a person's eyes varies depending on a traveling direction of light radiated from a light-emitting surface, that is, an angle of view of the person viewing a display surface.

With the display device described above, when the thickness of a charge transport layer on a light-emitting side of the light-emitting layer is the same among the colors red, green, blue, and the like of the emitted light, for example, light distribution characteristics, that is, the intensity of light depending on the traveling direction of the light, varies among wavelengths of the light. In general, light with a shorter wavelength, that is, green light and blue light, compared with red light, is radiated with a higher intensity in a direction more inclined with respect to the reference direction orthogonal to the display surface. Thus, when the display surface is viewed along a direction inclined with respect to the reference direction orthogonal to the display surface, the display surface may be viewed in more greenish or blueish colors, compared with a color on the display surface viewed along the reference direction.

That is, there is a difference in tint between a case where the display surface is viewed along the reference direction orthogonal to the display surface and a case where the display surface is viewed along a direction inclined with respect to the reference direction.

The disclosure has been made in view of the problem described above. An object of the disclosure is to provide a display device with a reduced difference in tint of a display surface between a case where the display surface is viewed along the reference direction orthogonal to the display surface and a case where the display surface is viewed along a direction inclined with respect to the reference direction.

Solution to Problem

A display device according to an aspect of the disclosure includes a plurality of light-emitting layers each configured to emit light in a reference direction orthogonal to a light-emitting surface, and a light-blocking portion configured to block part of light traveling from the light-emitting surface in directions inclined with respect to the reference direction, in which the plurality of light-emitting layers include a first light-emitting layer configured to emit light with a first peak wavelength and a second light-emitting layer configured to emit light with a second peak wavelength that is longer than the first peak wavelength, and the first light-emitting layer has, compared with the second light-emitting layer, a large ratio of the part of light blocked by the light-blocking portion to light traveling in at least one certain direction out of the inclined directions.

DESCRIPTION OF EMBODIMENTS

Figure 1:
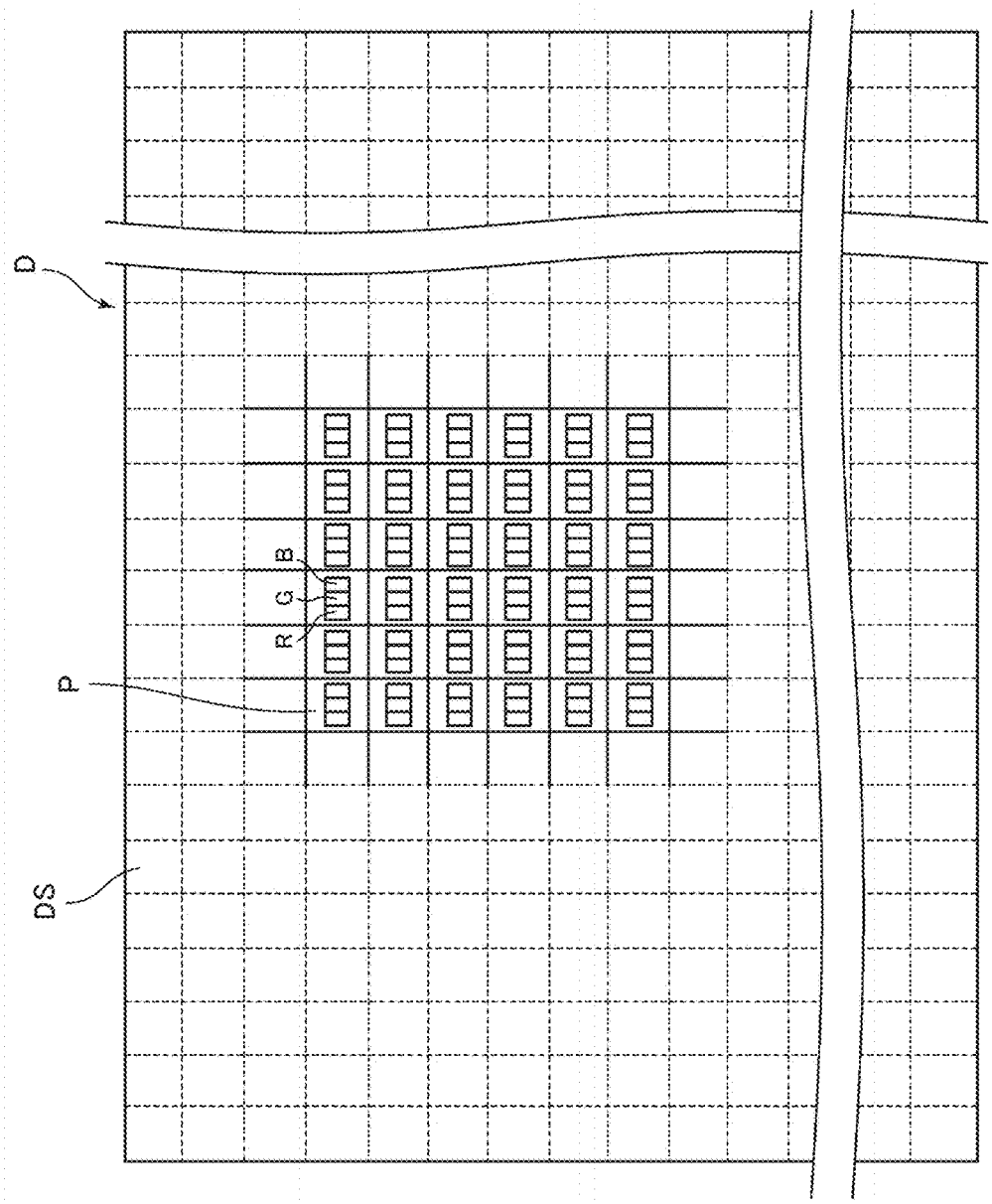
FIG. 1 is a schematic plan view illustrating a display surface, pixels, and subpixels of a display device of a first embodiment.

Hereinafter, a display device according to embodiments of the disclosure will be described with reference to the accompanying drawings. Note that, in the drawings, the same or equivalent elements are denoted by the same reference numerals and signs, and redundant descriptions thereof will be omitted.

First Embodiment

A display device D according to a first embodiment will be described with reference to FIGS. 1 to 16.

An overview of a configuration of the display device D according to the embodiment will be described with reference to FIG. 1. As illustrated in FIG. 1, the display device D includes a group of pixels P disposed in a matrix. A display surface DS is a virtual plane on which an image viewed by a person is displayed. In this specification, for the group of pixels P in a matrix, a lateral direction of the display device D, that is, the longer side direction of the rectangle, is defined as a row direction, and a vertical direction of the display device D, that is, the shorter side direction of the rectangle, is defined as a column direction.

Each of the group of pixels P includes a red subpixel R, a green subpixel G, and a blue subpixel B. In FIG. 1, a light-emitting surface of each of the red subpixel R, the green subpixel G, and the blue subpixel B is schematically illustrated.

The light-emitting surface is one of two opposite main surfaces of a light-emitting layer described below, and is the main surface that is on the side from which light emitted from the light-emitting layer is radiated to the outside of the display device D, that is, the main surface that is on the back side of the main surface that faces a reflection electrode. Specifically, the light-emitting surface is assumed to be a main surface on the upper side of the light-emitting layer in cross-sectional views and perspective views used for the following description. In this specification, the display surface DS described above is assumed to be formed by virtual planes including the respective light-emitting surfaces of the red subpixel R, the green subpixel G, and the blue subpixel B.

In this specification, unless otherwise specified, a "surface" means a plane limited to a portion where a member constituting the surface exists, whereas a "plane" means a plane without such a limitation. There may be a case where the light-emitting surfaces of the subpixels and the light-emitting layers thereof are on different planes, such as a case where the light-emitting surfaces of the red subpixel R, the green subpixel G, and the blue subpixel B are not on the same plane. In such a case, each subpixel and the light-emitting layer thereof are assumed to have individual light-emitting surfaces. Regarding the virtual plane and the display surface DS in the description on each subpixel, each subpixel is assumed to have an individual virtual plane and display surface DS.

The light-emitting surface of the red subpixel R, the light-emitting surface of the green subpixel G, and the light-emitting surface of the blue subpixel B can emit red light, green light, and blue light, respectively, in a radiating manner, with the reference direction orthogonal to the light-emitting surfaces serving as the center axis. The red light, the green light, and the blue light have, in this order, shorter peak wavelengths.

Thus, the following relationship holds: (the peak wavelength of the red light emitted from the light-emitting surface of the red subpixel R)>(the peak wavelength of the green light emitted from the light-emitting surface of the green subpixel G)>(the peak wavelength of the blue light emitted from the light-emitting surface of the blue subpixel B). Specifically, the peak wavelength of the red light emitted from a red light-emitting layer REML is, for example, from about 610 nm to about 780 nm. The peak wavelength of the green light emitted from a green light-emitting layer GEML is, for example, from about 500 nm to about 550 nm. The peak wavelength of the blue light emitted from a blue light-emitting layer BEML is, for example, from about 460 nm to about 500 nm.

A schematic configuration of each of the group of pixels P of the display device D of the first embodiment will be described with reference to FIG. 2.

Figure 2:
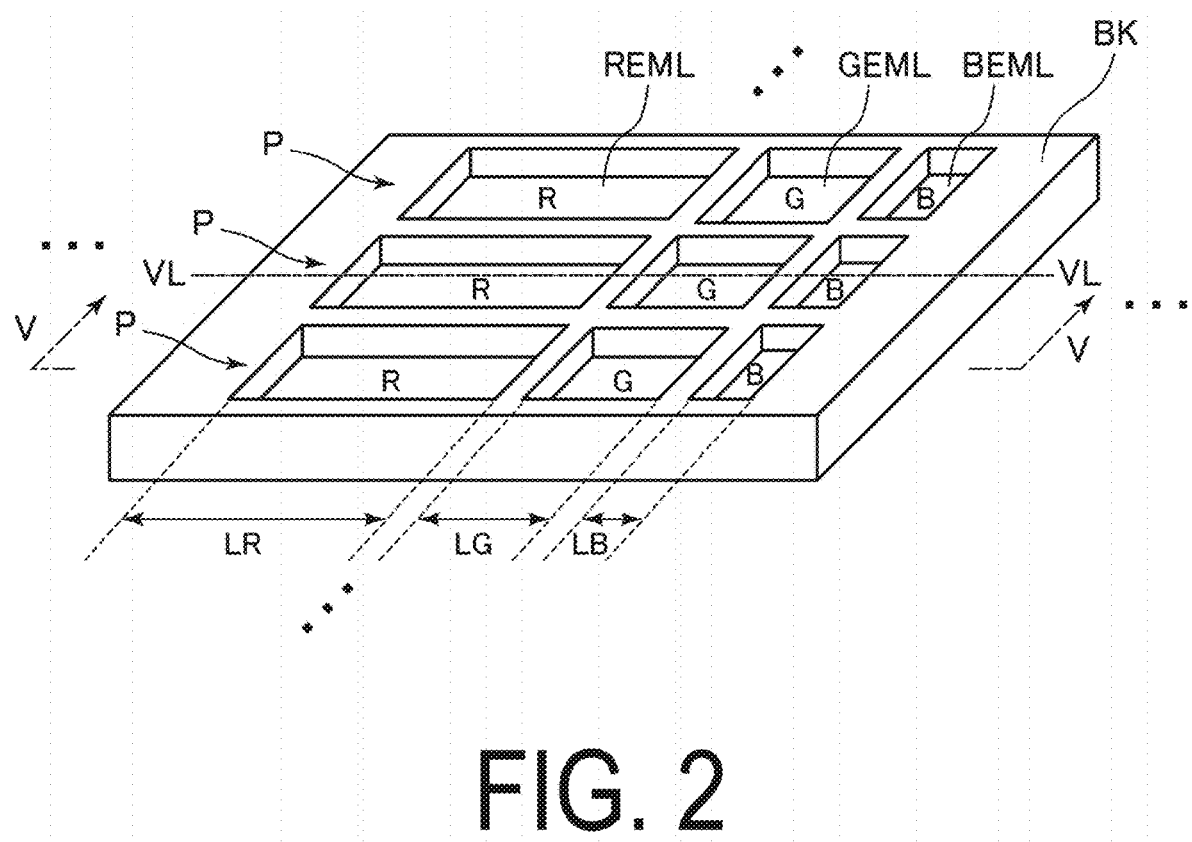
FIG. 2 is a schematic perspective view illustrating a structure of red subpixels, green subpixels, and blue subpixels forming the pixels of the display device of the first embodiment.

FIG. 2 illustrates three pixels P adjacent to each other in the display device D of the present embodiment. Each of the three pixels P includes the red subpixel R, the green subpixel G, and the blue subpixel B. As illustrated in FIG. 2, the red subpixel R, the green subpixel G, and the blue subpixel B are each surrounded by one common bank BK.

The bank BK is formed by a lattice portion and a frame portion surrounding the lattice portion, in plan view. The bank BK partitions a group of subpixels disposed in a matrix. However, the bank BK partitioning a group of subpixels is not an essential configuration of the display device D.

The bank BK functions as a light-blocking portion that can block light radiated from the light-emitting surfaces of the red light-emitting layer REML, the green light-emitting layer GEML, and the blue light-emitting layer BEML. The bank BK is formed of a material capable of absorbing or reflecting visible light. The visible light is light having wavelengths from about 380 nm to about 780 nm.

The bank BK blocks part of the light traveling from the light-emitting surface in a direction inclined with respect to the reference direction orthogonal to the light-emitting surface. The bank BK partitions the red light-emitting layer REML, the green light-emitting layer GEML, and the blue light-emitting layer BEML. The bank BK protrudes upward beyond the light-emitting surface of each of the red light-emitting layer REML, the green light-emitting layer GEML, and the blue light-emitting layer BEML.

As illustrated in FIG. 2, in the display device D, a plurality of the red subpixels R are arranged in a single row, a plurality of the green subpixels G are arranged in a single row, and a plurality of the blue subpixels B are arranged in a single row, in the column direction, that is, in the vertical direction.

In each of the three pixels P forming the pixels P of the present embodiment, the red subpixel R, the green subpixel G, and the blue subpixel B are arranged in a single row along a virtual straight line VL in the row direction, that is, the lateral direction. The light-emitting surface of the red subpixel R, the light-emitting surface of the green subpixel G, and the light-emitting surface of the blue subpixel B each have a rectangular shape. The lengths of the one side of the rectangular shapes that is along the virtual straight line VL described above are respectively denoted by LR, LG, and LB.

The relationship LR>LG>LB holds. For example, LR is 200 μm, LG is 100 μm, and LB is 50 μm. The light-emitting surfaces of the red subpixel R, the green subpixel G, and the blue subpixel B have the same length along the direction orthogonal to the virtual straight line VL described above, which is 100 μm for example.

A distance from a top face of the bank BK to the light-emitting surface of the red light-emitting layer REML, a distance from the top face of the bank BK to the light-emitting surface of the green light-emitting layer GEML, and a distance from the top face of the bank BK to the light-emitting surface of the blue light-emitting layer BEML are the same, and are 10 μm.

Thus, the area of the light-emitting surface of the blue light-emitting layer BEML is smaller than the area of the light-emitting surface of the green light-emitting layer GEML. The area of the light-emitting surface of the green light-emitting layer GEML is smaller than the area of the light-emitting surface of the red light-emitting layer REML. In other words, the following relationship holds: (the area of the light-emitting surface of the red light-emitting layer REML)>(the area of the light-emitting surface of the green light-emitting layer GEML)>(the area of the light-emitting surface of the blue light-emitting layer BEML).

On the other hand, the area of a shadow of the bank BK formed on the light-emitting surface of the red light-emitting layer REML, the area of a shadow of the bank BK formed on the light-emitting surface of the green light-emitting layer GEML, and the area of a shadow of the bank BK formed on the light-emitting surface of the blue light-emitting layer BEML are the same. Thus, regarding the ratio of the area of the shadow formed on the light-emitting surface to the area of the light-emitting surface, the following relationship holds: (red light-emitting layer REML)<(green light-emitting layer GEML)<(blue light-emitting layer BEML).

Figure 3:
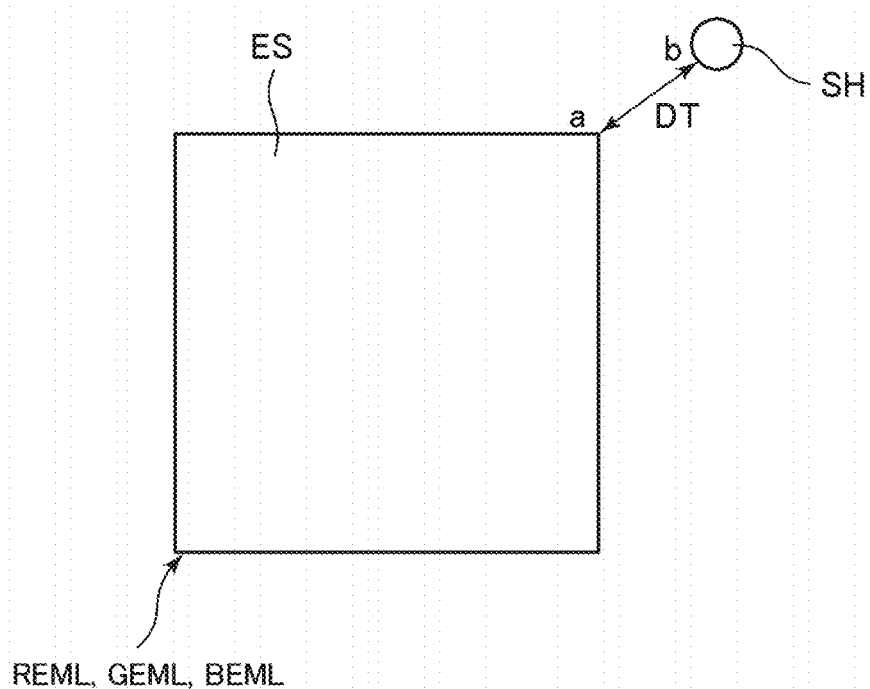
FIG. 3 is a plan view illustrating a distance between a light-emitting surface and a light-blocking portion.
Figure 4:
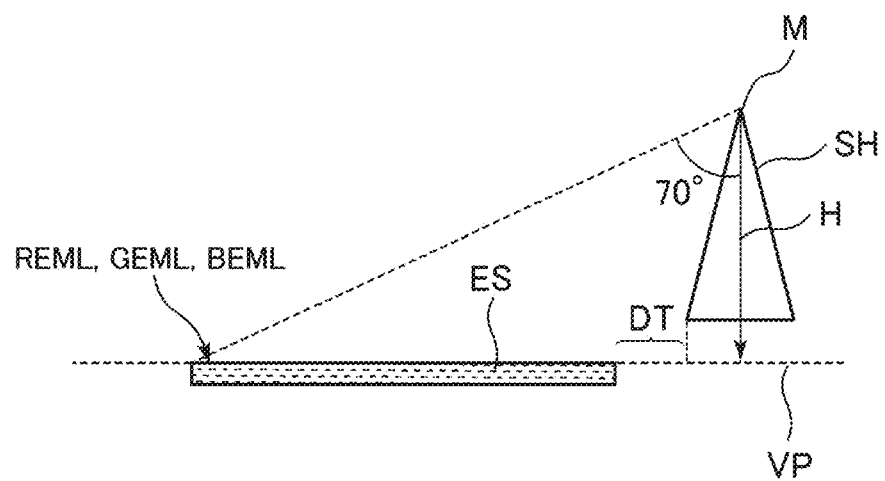
FIG. 4 is a cross-sectional view illustrating a height of the light-blocking portion.

As illustrated in FIG. 3 and FIG. 4, at least part of a light-blocking portion SH of this specification is located in the periphery of a light-emitting surface ES of the light-emitting layer and on the upper side of a virtual plane VP including the light-emitting surface ES of the light-emitting layer, that is, the virtual display surface DS. While it suffices if the light-blocking portion SH, for example, the bank BK, can block light only slightly, the transmittance of the light-blocking portion SH is preferably 50% or lower. Still, the transmittance of the light-blocking portion SH is more preferably about 10% to 20%.

In this specification, "periphery" when expressing the periphery of the light-emitting surface regarding the light-blocking portion SH means a region satisfying a condition (a distance DT between the light-emitting surface ES and the light-blocking portion SH in the virtual plane VP including the light-emitting surface)/(a height H of the light-blocking portion SH from the virtual plane VP)=2.7 (=tan 70°) or less.

This "distance DT between the light-emitting surface and the light-blocking portion SH in the virtual plane VP including the light-emitting surface" is a minimum value of the distance between a point a that is a certain point in the light-emitting surface and a point b that is a certain point in the light-blocking portion SH in the virtual plane VP including the light-emitting surface. The height H of the light-blocking portion SH from the virtual plane VP is a distance from the light-emitting surface to a highest point M in the light-blocking portion SH in a direction orthogonal to the light-emitting surface.

In general, in the use of a normal display device, the range in which the display surface DS of the display device D is viewed is considered to be the range of the conical shape from the reference direction orthogonal to the display surface DS to a direction inclined by approximately 700 with respect to the reference direction. Thus, when the display device D is viewed in an inclined direction, if the light-blocking portion SH is in the periphery of the light-emitting surface, a change in the tint can be reduced in a range of 0 to 700 from the reference direction orthogonal to the display surface DS.

The structure of each of the red subpixel R, the green subpixel G, and the blue subpixel B forming the pixel P of the display device D of the first embodiment will be described with reference to FIG. 5.

Figure 5:
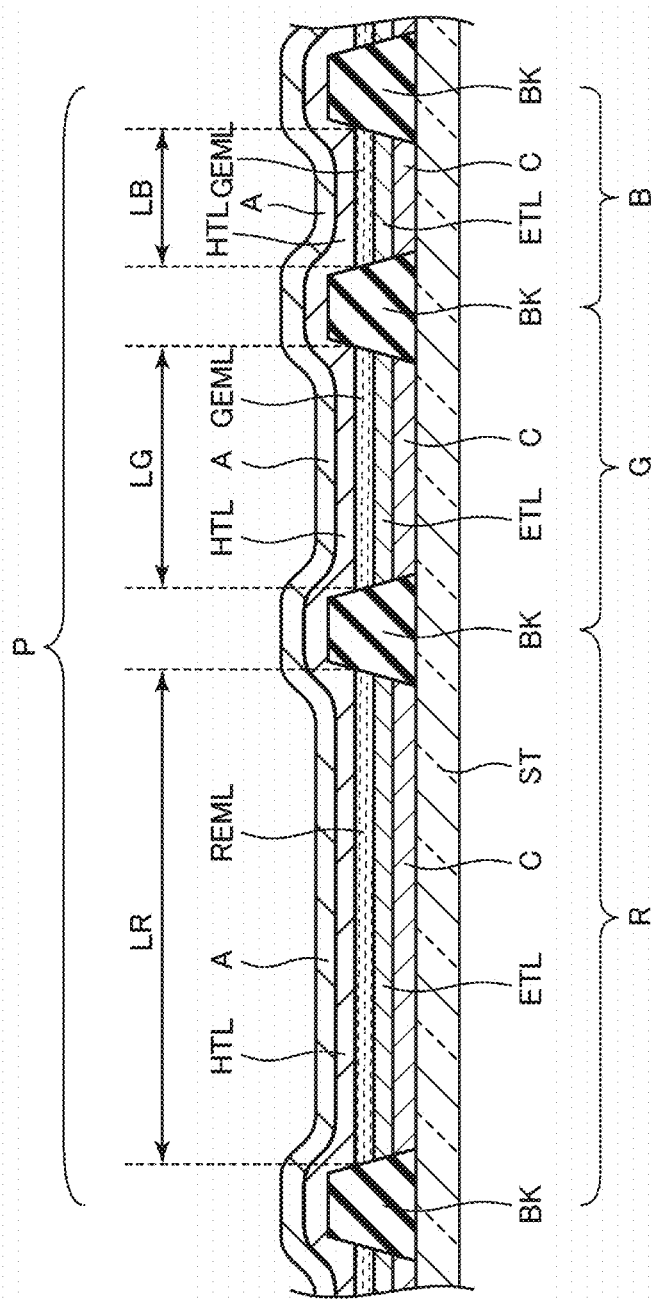
FIG. 5 is a cross-sectional view of part of the display device corresponding to a cross-sectional view taken along line V-V in FIG. 2.

As illustrated in FIG. 5, the display device D includes a substrate ST. The substrate ST includes a group of thin film transistors (TFTs) not illustrated. Each of the group of TFTs is electrically connected to any of the red subpixel R, the green subpixel G, and the blue subpixel B for switching the red subpixel R, the green subpixel G, and the blue subpixel B between an ON state and an OFF state.

The bank BK is formed on the substrate ST. With the bank BK, adjacent subpixels among the red subpixel R, the green subpixel G, and the blue subpixel B forming a single pixel P are partitioned from each other. Specifically, part of the bank BK is disposed between the red subpixel R and the green subpixel G. Another part of the bank BK is disposed between the green subpixel G and the blue subpixel B. Still another part of the bank BK is disposed between the blue subpixel B and the red subpixel R. The bank BK is disposed between the red subpixels R, between the green subpixels G, and between the blue subpixels B.

In FIG. 5, the light-emitting surface of the red light-emitting layer REML is an upper side surface of the red light-emitting layer REML, and is a surface on the side opposite to a surface facing the substrate ST in the present embodiment. In FIG. 5, the light-emitting surface of the green light-emitting layer GEML is an upper side surface of the green light-emitting layer GEML, and is a surface on the side opposite to a surface facing the substrate ST in the present embodiment.

In FIG. 5, the light-emitting surface of the blue light-emitting layer BEML is an upper side surface of the blue light-emitting layer BEML, and is a surface on the side opposite to a surface facing the substrate ST in the present embodiment. The light-emitting surface, which is surrounded by the bank BK in the present embodiment, may not be surrounded by the bank BK.

In FIG. 5, the following relationship holds: length LR of the light-emitting surface of the red subpixel R:length LG of the light-emitting surface of the green subpixel G:length LB of the light-emitting surface of the blue subpixel B=2:1:0.5. In the bank BK, a depth of the light-emitting surface of the red light-emitting layer REML, a depth of the light-emitting surface of the green light-emitting layer GEML, and a depth of the light-emitting surface of the blue light-emitting layer BEML are the same.

More specifically, a distance from the top face of the bank BK to the light-emitting surface of the red subpixel R, a distance from the top face of the bank BK to the light-emitting surface of the green subpixel G, and a distance from the top face of the bank BK to the light-emitting surface of the blue subpixel B are the same, and are 10 μm for example. A distance from the main surface of the substrate ST to the light-emitting surface of the red light-emitting layer REML, a distance from the main surface of the substrate ST to the light-emitting surface of the green light-emitting layer GEML, and a distance from the main surface of the substrate ST to the light-emitting surface of the blue light-emitting layer BEML are the same.

In the red subpixel R, a cathode C, an electron transport layer ETL, the red light-emitting layer REML, a common hole transport layer HTL, and a common anode A are disposed on the substrate ST in this order from the lower side. In the green subpixel G, the cathode C, the electron transport layer ETL, the green light-emitting layer GEML, the common hole transport layer HTL, and the common anode A are disposed on the substrate ST in this order from the lower side. In the blue subpixel B, the cathode C, the electron transport layer ETL, the blue light-emitting layer BEML, the common hole transport layer HTL, and the common anode A are disposed on the substrate ST in this order from the lower side.

In the present embodiment, the electron transport layer ETL, the hole transport layer HTL, and the anode A are transparent layers that transmit light emitted from each light-emitting layer. The cathode C is a reflection electrode that reflects the light emitted from each light-emitting layer.

The anode A and the cathode C are interchangeable in FIG. 5. In this case, the hole transport layer HTL and the electron transport layer ETL are also interchanged in FIG. 5. In this case, the electron transport layer ETL, the hole transport layer HTL, and the cathode C are transparent layers that transmit light emitted from each light-emitting layer. The anode A is a reflection electrode that reflects the light emitted from each light-emitting layer.

Thus, in any case, a portion disposed on the upper side of the light-emitting layer includes a transparent portion transmitting the light emitted from the light-emitting layer. A portion disposed on the lower side of the light-emitting layer includes a portion reflecting the light emitted from the light-emitting layer toward the upper side, that is, the light-emitting layer.

In the present embodiment, the red light-emitting layer REML, the green light-emitting layer GEML, the blue light-emitting layer BEML, and the bank BK are covered by the common hole transport layer HTL. Alternatively, three hole transport layers may respectively and individually cover the red light-emitting layer REML, the green light-emitting layer GEML, and the blue light-emitting layer BEML. Also in this case, the three hole transport layers are covered by the common anode A. Still, three anodes may be disposed over the three hole transport layers, that is, over the red light-emitting layer REML, the green light-emitting layer GEML, and the blue light-emitting layer BEML individually.

The display device D of the present embodiment includes the anode A covering the entirety of the red light-emitting layer REML, the green light-emitting layer GEML, and the blue light-emitting layer BEML. The anode A functions as a transparent common electrode. In this case, one anode A supplies charge to each of the red light-emitting layer REML, the green light-emitting layer GEML, and the blue light-emitting layer BEML, or is supplied with charge from each of the red light-emitting layer REML, the green light-emitting layer GEML, and the blue light-emitting layer BEML. Alternatively, in FIG. 5, the cathode C may be disposed at the position of the anode A, and form the transparent common electrode described above.

The display device D of the present embodiment includes the hole transport layer HTL covering the entirety of the red light-emitting layer REML, the green light-emitting layer GEML, and the blue light-emitting layer BEML. The hole transport layer HTL functions as a transparent common charge transport layer. In this case, one hole transport layer HTL transports charge to each of the red light-emitting layer REML, the green light-emitting layer GEML, and the blue light-emitting layer BEML, or receives charge transported from each of the red light-emitting layer REML, the green light-emitting layer GEML, and the blue light-emitting layer BEML.

In the present embodiment, each of the red light-emitting layer REML, the green light-emitting layer GEML, and the blue light-emitting layer BEML may be a light-emitting layer formed by a QLED, but may be a light-emitting layer formed by any other materials such as OLED.

Figure 6:
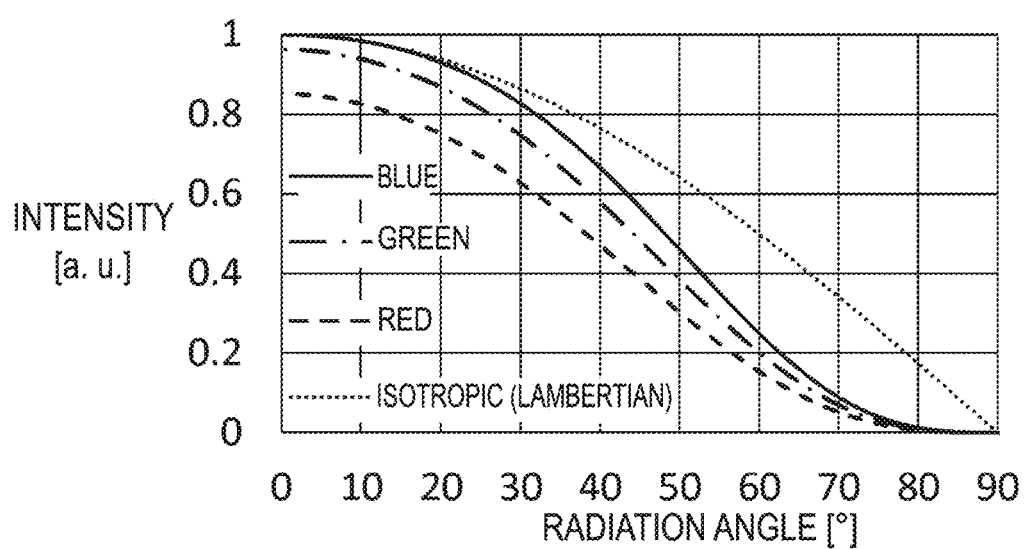
FIG. 6 is a graph illustrating the relationship between a light radiation angle and a light intensity for each color of light emitted from a light-emitting surface of a light-emitting layer.

FIG. 6 is a graph illustrating the relationship between a light radiation angle and a light intensity for each color of light emitted from the light-emitting surface of the light-emitting layer.

The reason why red light, green light, and blue light each satisfy the relationship between the radiation angle and the intensity as illustrated in FIG. 6 will be described below.

Figure 7:
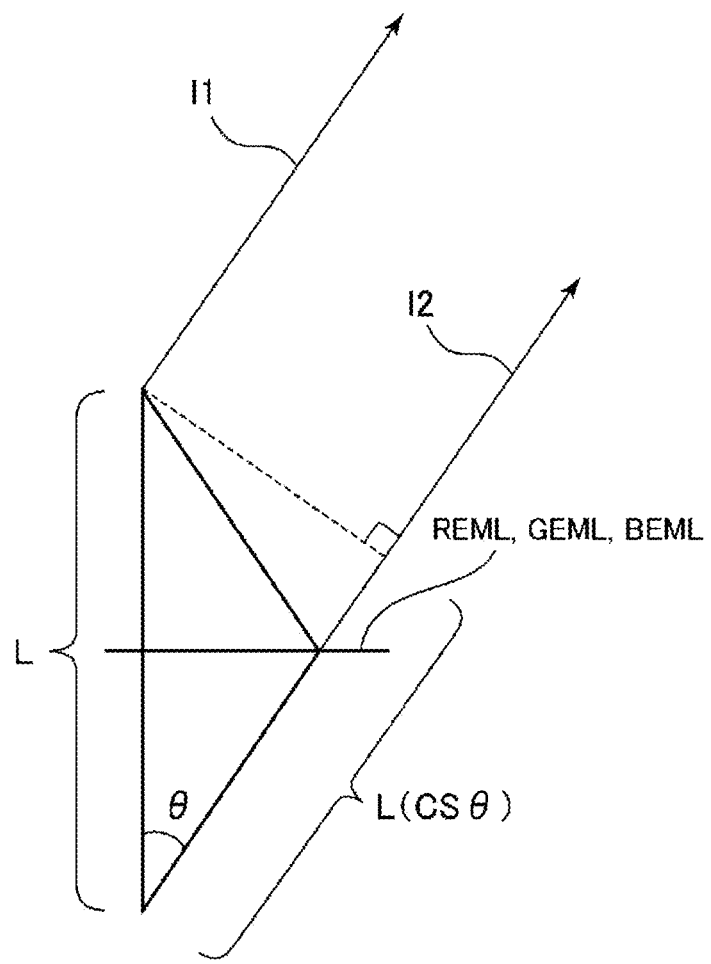
FIG. 7 is a diagram illustrating an optical path difference.

An optical path length difference L between two light beams l1 and l2 traveling along the reference direction orthogonal to the light-emitting surface will be considered with reference to FIG. 7. The light beam l1 out of the two light beams l1 and l2 is light radiated to the outside, from a light emission point of the light-emitting layer through the charge transport layer on one side. The light beam l2 out of the two light beams l1 and l2 described above is light that travels from the light emission point of the light-emitting layer toward the side opposite to the charge transport layer on one side, and is reflected on an interface between the light-emitting layer and the charge transport layer on the other side, to be radiated to the outside through the light-emitting layer and the charge transport layer.

A thickness of the light-emitting layer is denoted by d1, a refractive index of the light-emitting layer is denoted by n1, a thickness of a charge (electron or hole) transport layer is denoted by d2, and a refractive index of the charge transport layer is denoted by n2. The light emission point is assumed to be the center position of the light-emitting layer in the thickness direction. The wavelength of the light is denoted by $\lambda$.

In this case, the following relationship holds: optical path length difference $L=2(n1 \cdot d1/2 + n2 \cdot d2)$. The intensity of light is proportional to $\sin^2(\pi L/\lambda)$.

Thus, when $\pi L/\lambda = (2a+1)\pi/2$, that is, $L=(2a+1)\times\lambda/2$ (a is 0 or a natural number), the two light beams described above are constructive. Also, when $\pi L/\lambda = b\pi$, i.e., $L=b\lambda$ (b is a natural number), the two light beams described above are destructive.

For example, when $\lambda$blue=465 nm and L=233 nm for the blue subpixel B, the two above-described light beams of the blue color traveling along the reference direction orthogonal to the light-emitting surface, from the light-emitting surface of the blue light-emitting layer BEML, are constructive when $L/\lambda=0.5$. In this case, when $\lambda$red=620 nm and L=233 nm for the red subpixel R, $L/\lambda=0.37$, and when $\lambda$green=530 nm and L=233 nm for the green subpixel G, $L/\lambda=0.44$, meaning that the condition under which the two above-described light beams are constructive is not satisfied.

For the simplicity of the calculation, the refractive index and the position of the light emission point, that is, the optical path length difference L is assumed to be not color dependent.

An optical path length difference between two light beams traveling along a direction inclined by an angle $\theta$ with respect to the reference direction orthogonal to the light-emitting surface is denoted by L cos $\theta$. Thus, the intensity of light traveling along the direction inclined by the angle $\theta$ with respect to the reference direction orthogonal to the light-emitting surface is calculated by the following formula: $\sin^2[\pi L/\lambda \cos \theta]$.

Thus, the orientation characteristics of the light traveling along the direction inclined by the angle $\theta$ with respect to the reference direction orthogonal to the light-emitting surface is as follows.

Red light: $\sin^2[0.37 \pi \cos \theta]$
Green light: $\sin^2[0.44 \pi \cos \theta]$
Blue light: $\sin^2[0.50 \pi \cos \theta]$ Using these orientation characteristics, a graph as illustrated in FIG. 6 above is generated. It can be understood from FIG. 6 that when the common charge transport layer is used, for example, the common hole transport layer HTL illustrated in FIG. 5, the red light, the green light, and the blue light have this descending order of intensity of light traveling along the reference direction orthogonal to the light-emitting surface.

Figure 8:
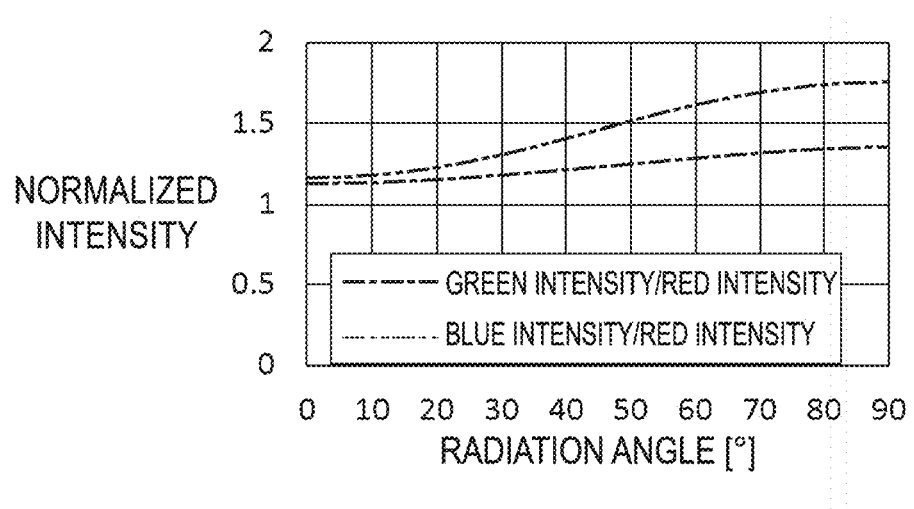
FIG. 8 is a graph illustrating the relationship between each of a ratio of green intensity to red intensity and a ratio of blue intensity to the red intensity, and a radiation angle of light.

As illustrated in FIG. 8, it can be understood that a ratio of the intensity of the green light to the intensity of the red light and a ratio of the intensity of the blue light to the intensity of the red light each increase gradually.

Figure 9:
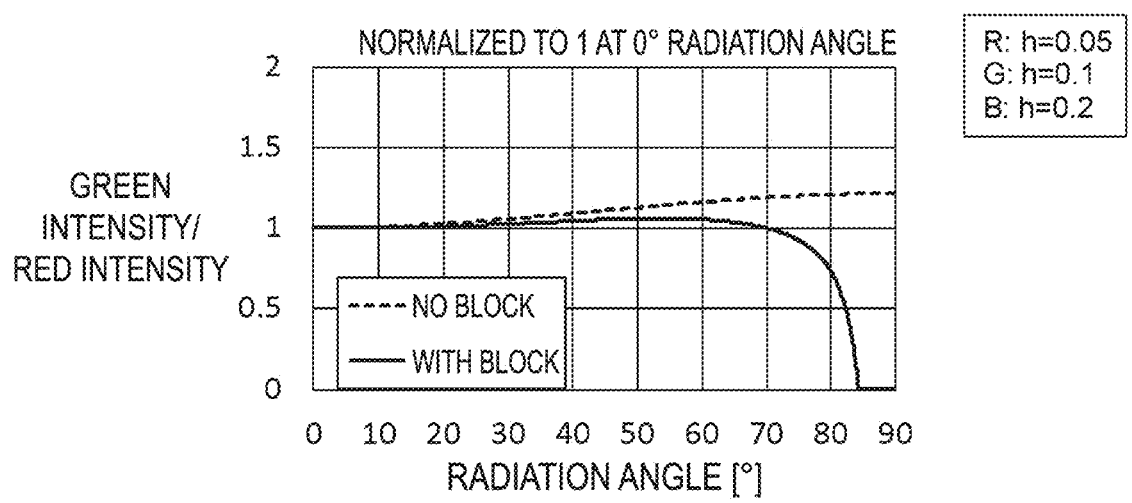
FIG. 9 is a graph illustrating the relationship between the radiation angle of light and the ratio of the green intensity to the red intensity of the light in a case of the display device (with block) of the first embodiment and in a case of a display device (no block) of Comparative Example.

With reference to FIG. 9, a description will be given on the relationship between the radiation angle of light and a ratio of green intensity (intensity of green light) to red intensity (intensity of red light) of the light in a case of the display device D (with block) of the present embodiment and in a case of a display device (no block) of Comparative Example. Values h in FIG. 9 are obtained by (the depth of the light-emitting surface of the green light-emitting layer GEML)/(the length of the light-emitting surface of the green light-emitting layer GEML in the lateral direction), that is, (the distance from the top face of the bank BK in FIG. 2 to the light-emitting surface of the green light-emitting layer GEML)/(the length of one side of the light-emitting surface of the green light-emitting layer GEML along line V-V in FIG. 2).

From FIG. 9, it can be understood that the ratio of the green intensity to the red intensity of the display device of Comparative Example gradually increases while the radiation angle is in a range from 0° to 90°. On the other hand, it can be understood that the ratio of the green intensity to the red intensity of the display device D of the present embodiment is substantially the same while the radiation angle is in a range from 0° to about 70°. Thus, it can be understood that a difference between the red intensity and the green intensity on the display surface DS as viewed along a direction inclined with respect to the reference direction orthogonal to the display surface DS can be reduced.

Figure 10:
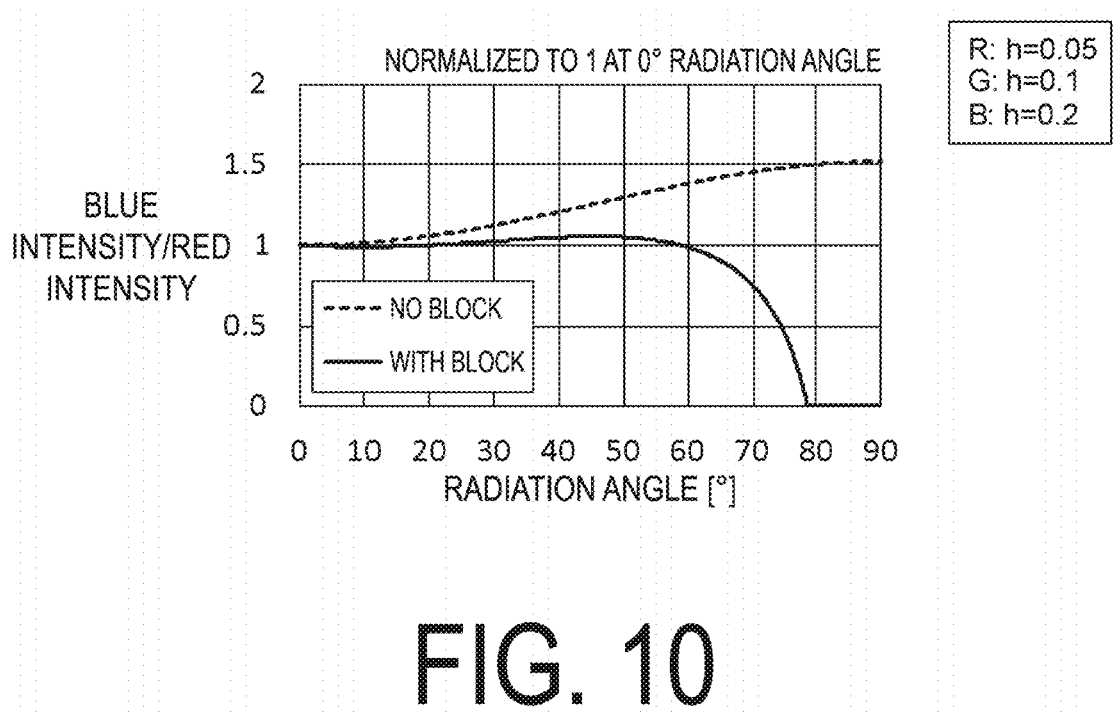
FIG. 10 is a graph illustrating the relationship between the radiation angle of light and the ratio of the blue intensity to the red intensity of the light in a case of the display device (with block) of the first embodiment and in a case of the display device (no block) of Comparative Example.

With reference to FIG. 10, a description will be given on the relationship between the radiation angle of light and a ratio of blue intensity (intensity of blue light) to red intensity (intensity of red light) of the light in a case of the display device D (with block) of the present embodiment and in a case of the display device (no block) of Comparative Example. Values h in FIG. 10 are obtained by (the depth of the light-emitting surface of the blue light-emitting layer BEML)/(the length of the light-emitting surface of the blue light-emitting layer BEML in the lateral direction), that is, (the distance from the top face of the bank BK in FIG. 2 to the light-emitting surface of the blue light-emitting layer BEML)/(the length of one side of the light-emitting surface of the blue light-emitting layer BEML along line V-V in FIG. 2).

From FIG. 10, it can be understood that the ratio of the blue intensity to the red intensity of the display device of Comparative Example gradually increases while the radiation angle is in a range from 0° to 90°. On the other hand, it can be understood that the ratio of the blue intensity to the red intensity of the display device D of the present embodiment is substantially the same while the radiation angle is in a range from 0° to about 60°. Thus, it can be understood that a difference between the red intensity and the blue intensity on the display surface DS as viewed along a direction inclined with respect to the reference direction orthogonal to the display surface DS can be reduced.

In this specification, the radiation angle described above is assumed to be indicated by an angle of a direction inclined with respect to the reference direction orthogonal to the light-emitting surface, with the direction orthogonal to the light-emitting surface assumed to be 0°.

From FIG. 9 and FIG. 10, it can be understood that the display device D of the present embodiment can be provided as the display device D with a reduced difference between a tint on the display surface DS as viewed along the reference direction orthogonal to the display surface DS and a tint on the display surface DS as viewed along a direction inclined with respect to the reference direction, compared with the display device of Comparative Example.

With reference to FIGS. 11 to 16, a shadow of the light-blocking portion formed on the light-emitting surface will be described.

Figure 11:
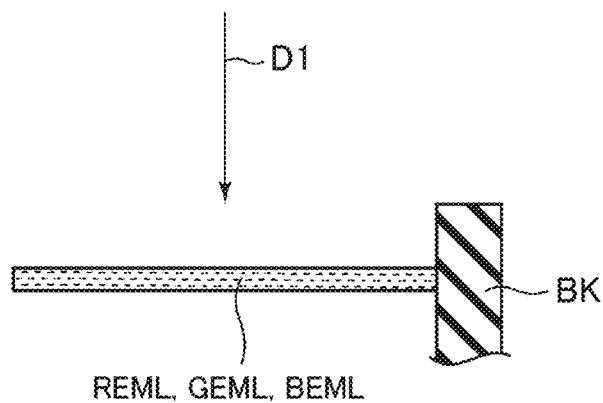
FIG. 11 is a cross-sectional view of the light-emitting layer and the light-blocking portion, illustrating a case where when light along a reference direction orthogonal to the light-emitting surface of each subpixel is incident on the light-emitting surface, no shadow of the light-blocking portion is formed on the light-emitting surface.
Figure 12:
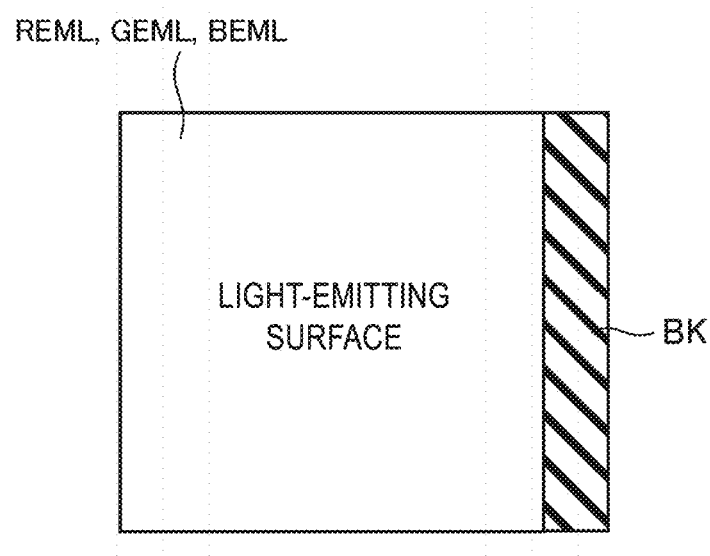
FIG. 12 is a plan view of the light-emitting layer and the light-blocking portion, illustrating a case where when light along the reference direction orthogonal to the light-emitting surface of each subpixel is incident on the light-emitting surface, no shadow of the light-blocking portion is formed on the light-emitting surface.

As illustrated in FIG. 11 and FIG. 12, in each of the red light-emitting layer REML, the green light-emitting layer GEML, and the blue light-emitting layer BEML, when light is incident on the light-emitting surface along a reference direction D1 orthogonal to the light-emitting surface, no shadow of the bank BK serving as the light-blocking portion is formed on the light-emitting surface.

Figure 13:
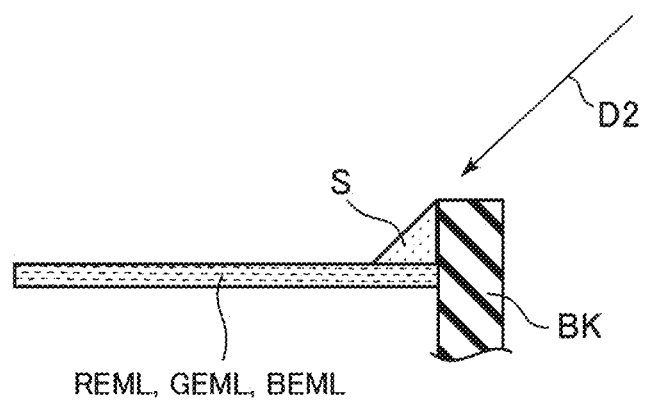
FIG. 13 is a cross-sectional view of the light-emitting layer and the light-blocking portion, illustrating a first shadow of the light-blocking portion formed on the light-emitting surface, when light along a first direction inclined with respect to the reference direction orthogonal to the light-emitting surface of each subpixel is incident on the light-emitting surface.
Figure 14:
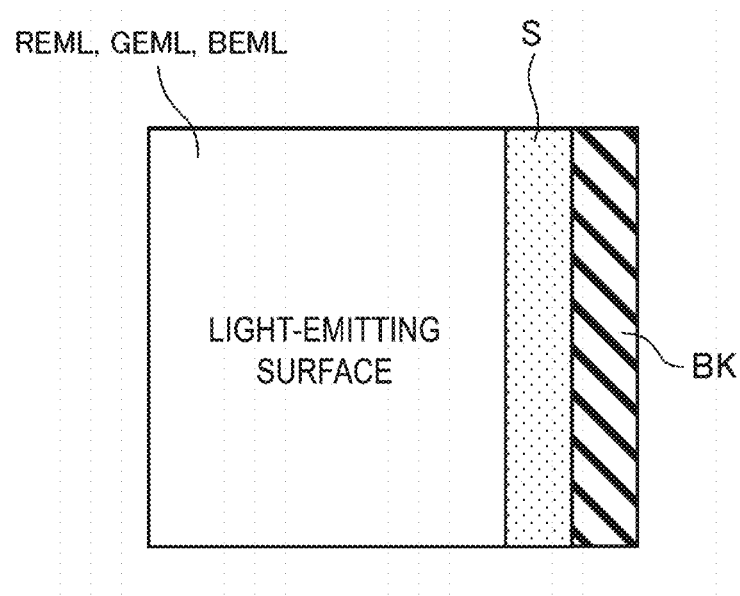
FIG. 14 is a plan view of the light-emitting layer and the light-blocking portion, illustrating the first shadow of the light-blocking portion formed on the light-emitting surface, when light along the first direction inclined with respect to the reference direction orthogonal to the light-emitting surface of each subpixel is incident on the light-emitting surface.

FIG. 13 and FIG. 14 illustrate a first shadow S of the bank BK serving as the light-blocking portion formed on the light-emitting surface. FIG. 13 and FIG. 14 illustrate the shadow S in a case where light is incident on the light-emitting surface along a first direction D2 inclined with respect to the reference direction D1 orthogonal to the light-emitting surface, in each of the red light-emitting layer REML, the green light-emitting layer GEML, and the blue light-emitting layer BEML.

Figure 15:
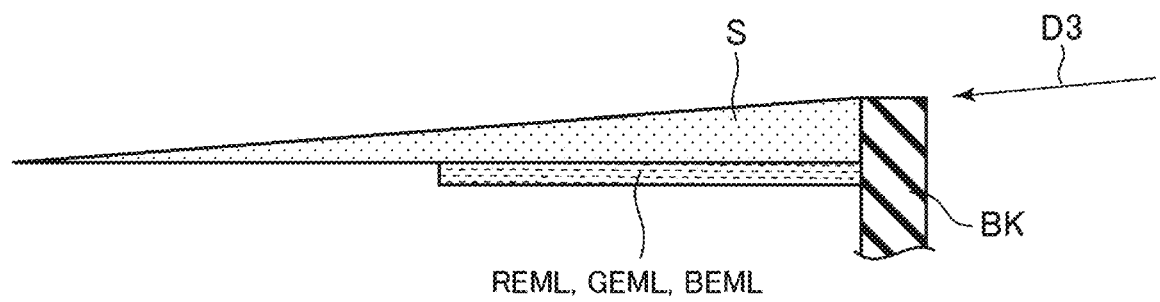
FIG. 15 is a cross-sectional view of the light-emitting layer and the light-blocking portion, illustrating a second shadow of the light-blocking portion formed on the light-emitting surface, when light along a second direction inclined with respect to the reference direction orthogonal to the light-emitting surface is incident on the light-emitting surface.
Figure 16:
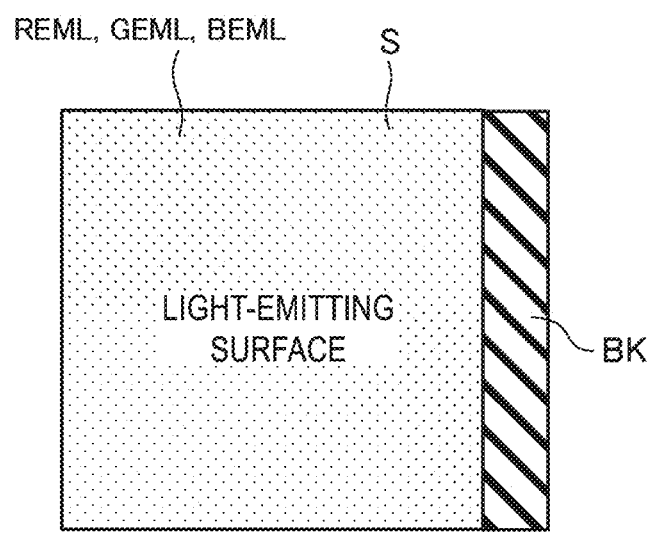
FIG. 16 is a plan view of the light-emitting layer and the light-blocking portion, illustrating the second shadow of the light-blocking portion formed on the light-emitting surface, when light along the second direction inclined with respect to the reference direction orthogonal to the light-emitting surface is incident on the light-emitting surface.

FIG. 15 and FIG. 16 illustrate a second shadow S of the bank BK serving as the light-blocking portion formed on the light-emitting surface. FIG. 15 and FIG. 16 illustrate the shadow S in a case where light is incident on the light-emitting surface along a second direction D3 inclined with respect to the reference direction D1 orthogonal to the light-emitting surface, in each of the red light-emitting layer REML, the green light-emitting layer GEML, and the blue light-emitting layer BEML.

As illustrated in FIG. 11 to FIG. 16, the area of the shadow S of the light traveling along the second direction D3 with a relatively large angle of inclination with respect to the reference direction D1 on the light-emitting surface is larger than the area of the shadow S of the light traveling along the first direction D2 with a relatively small angle of inclination with respect to the reference direction D1 on the light-emitting surface.

As described above, regarding the relationship among the red light-emitting layer REML, the green light-emitting layer GEML, and the blue light-emitting layer BEML, the ratio of the area of the shadow S of the bank BK serving as the light-blocking portion to the area of the light-emitting surface varies. On the other hand, regarding the relationship between the red light-emitting layers REML, the relationship between the green light-emitting layers GEML, and the relationship between the blue light-emitting layers BEML, the ratio of the area of the shadow S of the light-blocking portion to the area of the light-emitting surface is the same.

It is assumed that the red light-emitting layer REML, the green light-emitting layer GEML, the blue light-emitting layer BEML, and the bank BK (light-blocking portion) are irradiated with virtual light traveling in a direction (for example, the first direction D2 or the second direction D3: a certain direction) inclined with respect to the reference direction D1 orthogonal to the light-emitting surface described above. In this case, the blue light-emitting layer BEML has, compared with the green light-emitting layer GEML, a large ratio of the area of the shadow S of the bank BK (light-blocking portion) projected on the light-emitting surface to the area of the light-emitting surface. The green light-emitting layer GEML has, compared with the red light-emitting layer REML, a large ratio of the area of the shadow S of the bank BK (light-blocking portion) projected on the light-emitting surface to the area of the light-emitting surface.

In other words, the blue light-emitting layer BEML has, compared with the green light-emitting layer GEML, a large ratio of light blocked (absorbed or reflected) by the bank BK (light-blocking portion) to the light traveling in at least one certain direction out of directions inclined with respect to the reference direction D1 orthogonal to the light-emitting surface. The green light-emitting layer GEML has, compared with the red light-emitting layer REML, a large ratio of light blocked (absorbed or reflected) by the bank BK (light-blocking portion) to the light traveling in at least one certain direction out of the directions inclined with respect to the reference direction orthogonal to the light-emitting surface.

Thus, the display device D can reduce a difference between the tint on the display surface DS as viewed along the reference direction D1 orthogonal to the display surface DS and the tint on the display surface DS as viewed along a direction inclined with respect to the reference direction orthogonal to the display surface DS in the row direction.

In the display device D of the present embodiment, the distance between the top face of the bank BK and the light-emitting surface is the same among the red light-emitting layer REML, the green light-emitting layer GEML, and the blue light-emitting layer BEML. Thus, the difference in tint on the display surface DS due to a difference in viewing directions can be reduced using a simple method of setting the area of the light-emitting surface of the red light-emitting layer REML, the area of the light-emitting surface of the green light-emitting layer GEML, and the area of the light-emitting surface of the blue light-emitting layer BEML different from each other in the design stage.

Note that, the film thickness of the common charge transport layer, specifically, the hole transport layer HTL, is a film thickness with which blue light beams are constructive through interference when the display surface DS is viewed along the reference direction orthogonal to the display surface DS. For example, when the display surface DS is viewed along the reference direction orthogonal to the display surface DS, the intensity of the blue light with low emission efficiency is increased through interference, whereby the brightness of the blue light with low emission efficiency can be improved.

Generally, when a value of at least one of the optical path length difference and the wavelength is adjusted to make the orientation characteristics independent of the color of the emitted light, the thickness of the charge transport layer, for example, the hole transport layer HTL, is adjusted for each color of light emitted from the light-emitting layer. In this case, the charge transport layer common to a plurality of light-emitting layers, which is the hole transport layer HTL in the present embodiment, cannot be manufactured with a single manufacturing step. This complicates the manufacturing process of the display device D.

On the other hand, in the display device D of the present embodiment, the blocking ratio of the light emitted from the light-emitting surface by the bank BK serving as the light-blocking portion is set to be different among the red light-emitting layer REML, the green light-emitting layer GEML, and the blue light-emitting layer BEML.

With this configuration, the method of manufacturing the display device D can be simple compared with a case where the charge transport layer, for example, the hole transport layer HTL, is provided for each of the red subpixel R, the green subpixel G, and the blue subpixel B individually.

With the display device D of the present embodiment, the structure and the manufacturing method can be simple compared with cases described below, specifically, a case where a height position of the light-emitting surface is set to be different among the light-emitting layers emitting light of different colors and a case where a wall portion or a conical portion is disposed on the upper side of the bank BK.

Second Embodiment

A display device D according to a second embodiment will be described with reference to FIGS. 17 and 18. Note that redundant description of points is similar to those in the first embodiment will be omitted in the description below. The display device D of the present embodiment differs from the display device D of the first embodiment in the following respects.

Figure 17:
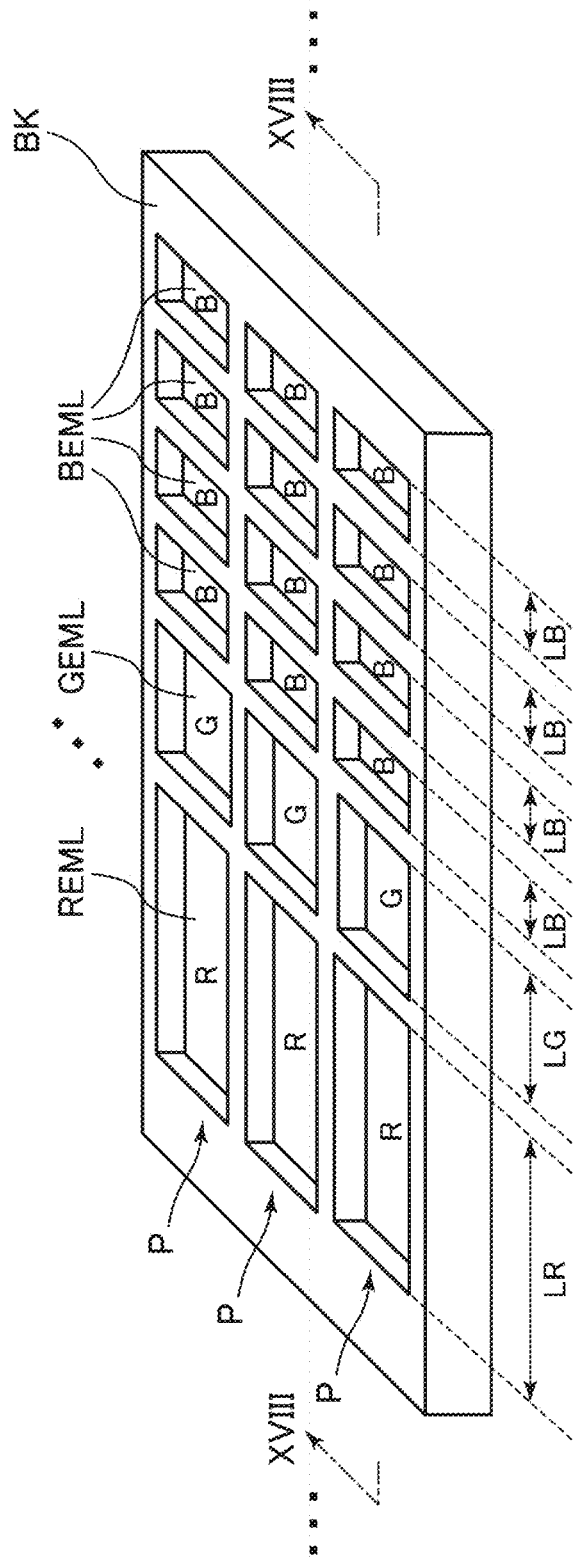
FIG. 17 is a schematic perspective view illustrating a structure of red subpixels, green subpixels, and blue subpixels forming pixels of a display device of a second embodiment.
Figure 18:
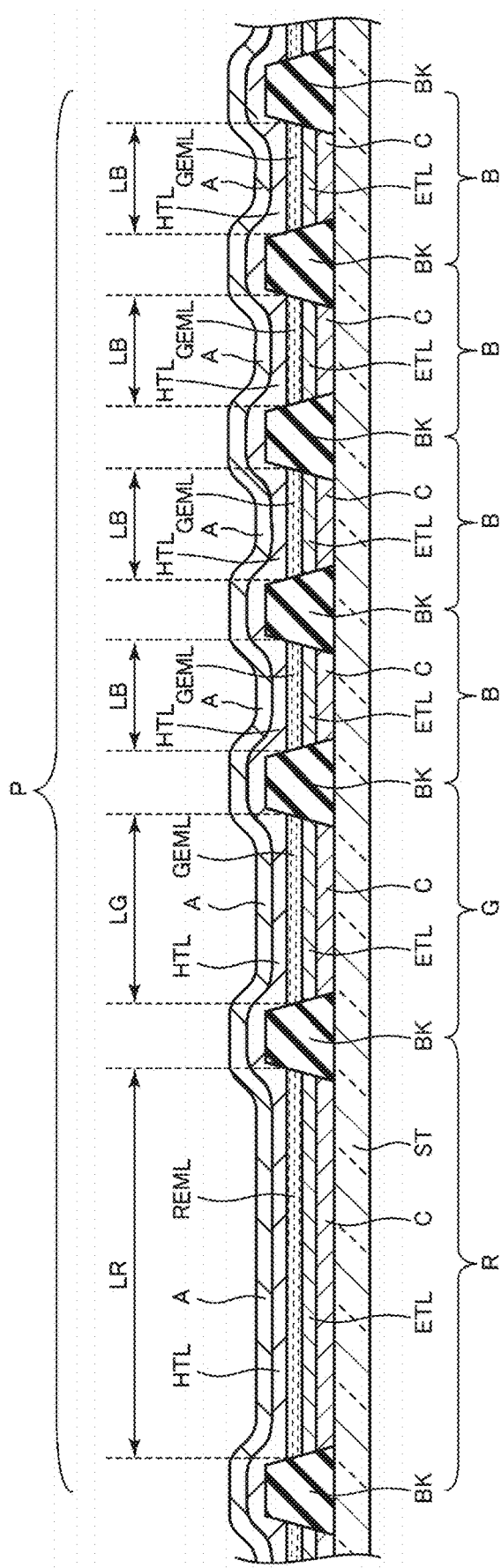
FIG. 18 is a cross-sectional view of part of the display device corresponding to a cross-sectional view taken along line XVIII-XVIII in FIG. 17.

As illustrated in FIGS. 17 and 18, in the present embodiment, among the red light-emitting layers REML, the green light-emitting layers GEML, and the blue light-emitting layers BEML, the number of blue light-emitting layers BEML having the lowest emission efficiency is larger than the number of red light-emitting layers REML and green light-emitting layers GEML. Specifically, the number of red light-emitting layers REML is three and the number of green light-emitting layers GEML is three, whereas the number of blue light-emitting layers BEML is twelve. Meanwhile, also in the present embodiment, the ratio of the area of the shadow of the bank BK formed on the light-emitting surface of the blue light-emitting layers BEML to the area of the light-emitting surface of the blue light-emitting layers BEML is the same as that in the first embodiment.

Thus, the display device D of the present embodiment can reduce the difference in tint described above in the same manner as with the display device D of the first embodiment. With the display device D of the present embodiment, since the area of the light-emitting surface of the blue subpixel B is larger than the areas of the light-emitting surfaces of the other subpixels, the emission amount of the blue subpixel B, having the lowest emission efficiency among the three pixels P, can be increased compared with the display device D of the first embodiment.

Third Embodiment

A display device D according to a third embodiment will be described with reference to FIGS. 19 to 21. Note that redundant description of points is similar to those in the first embodiment will be omitted in the description below. The display device D of the present embodiment differs from the display device D of the first embodiment in the following respects.

Figure 19:
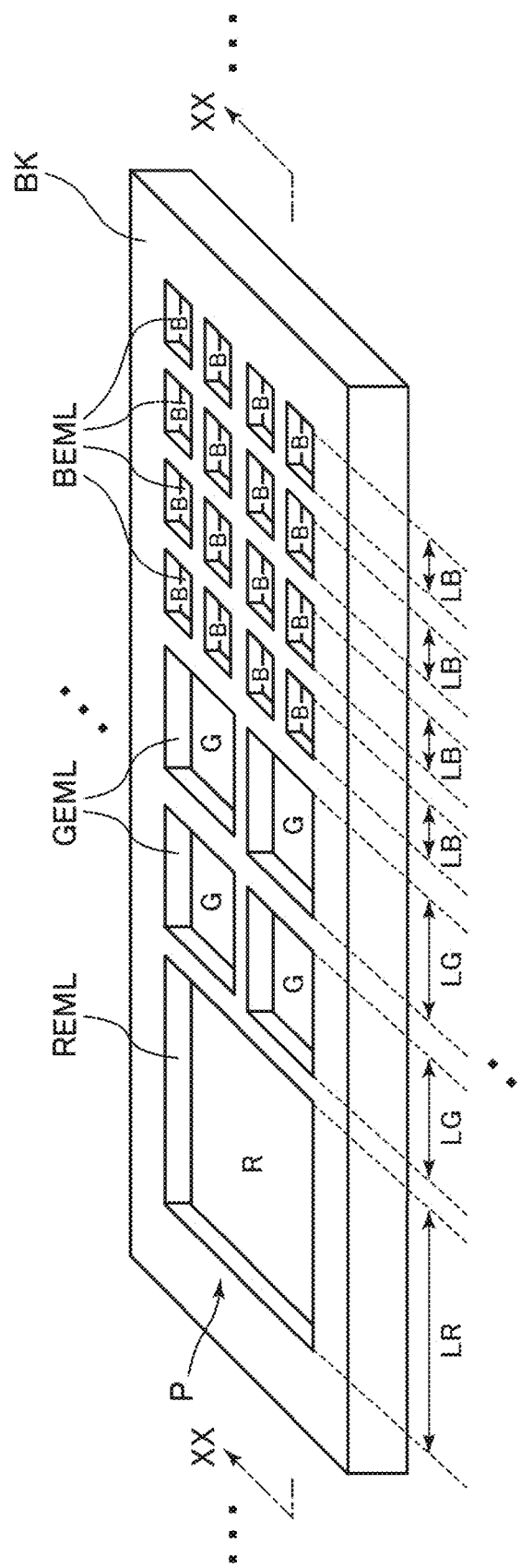
FIG. 19 is a schematic perspective view illustrating a structure of a red subpixel, green subpixels, and blue subpixels forming four pixels of a display device of a third embodiment.

As illustrated in FIG. 19, in the present embodiment, the number of green light-emitting layers GEML is larger than the number of red light-emitting layers REML in each of the group of pixels P. In each of the group of pixels P, the number of blue light-emitting layers BEML is larger than the number of green light-emitting layers GEML.

That is, in the present embodiment, in one pixel P, the following relationship holds: (the number of red light-emitting layers REML)<(the number of green light-emitting layers GEML)<(the number of blue light-emitting layers BEML).

More specifically, the number of red light-emitting layers REML is one, the number of green light-emitting layers GEML is four, and the number of blue light-emitting layers BEML is sixteen. Thus, in one pixel P, the difference among the total area of the light-emitting surface of the red light-emitting layer REML, the total area of the light-emitting surfaces of the green light-emitting layers GEML, and the total area of the light-emitting surfaces of the blue light-emitting layers BEML is reduced.

Figure 20:
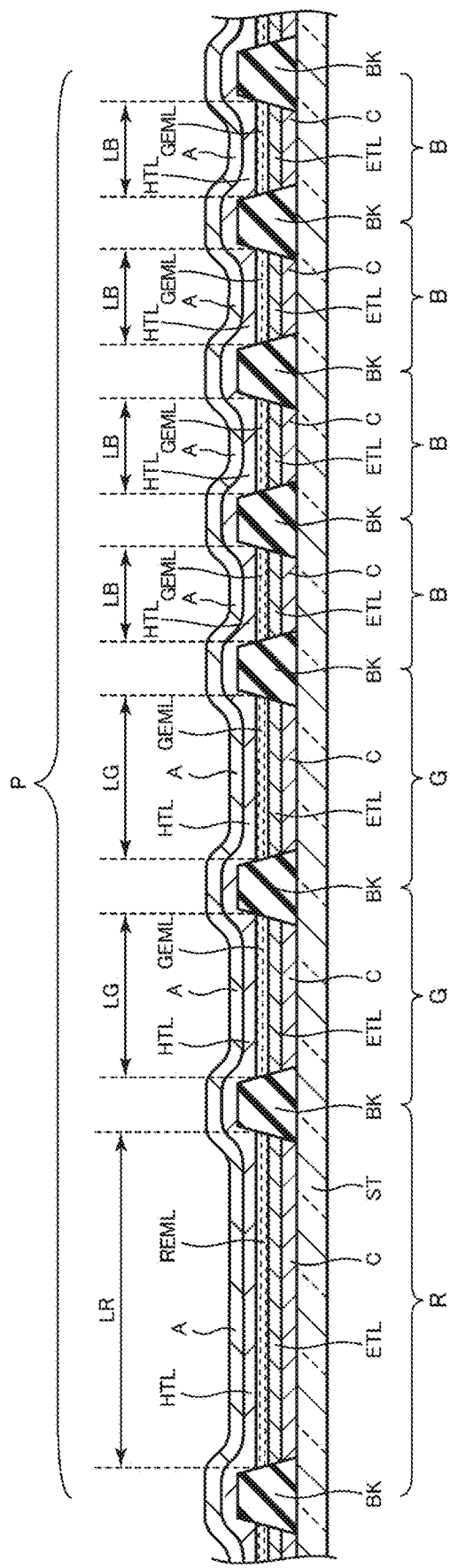
FIG. 20 is a cross-sectional view of part of the display device corresponding to a cross-sectional view taken along line XX-XX in FIG. 19.

In addition, as illustrated in FIG. 20, the following relationship holds: length LR of the light-emitting surface of the red subpixel R:length LG of the light-emitting surface of the green subpixel G:length LB of the light-emitting surface of the blue subpixel B=2:1:0.5.

Figure 21:
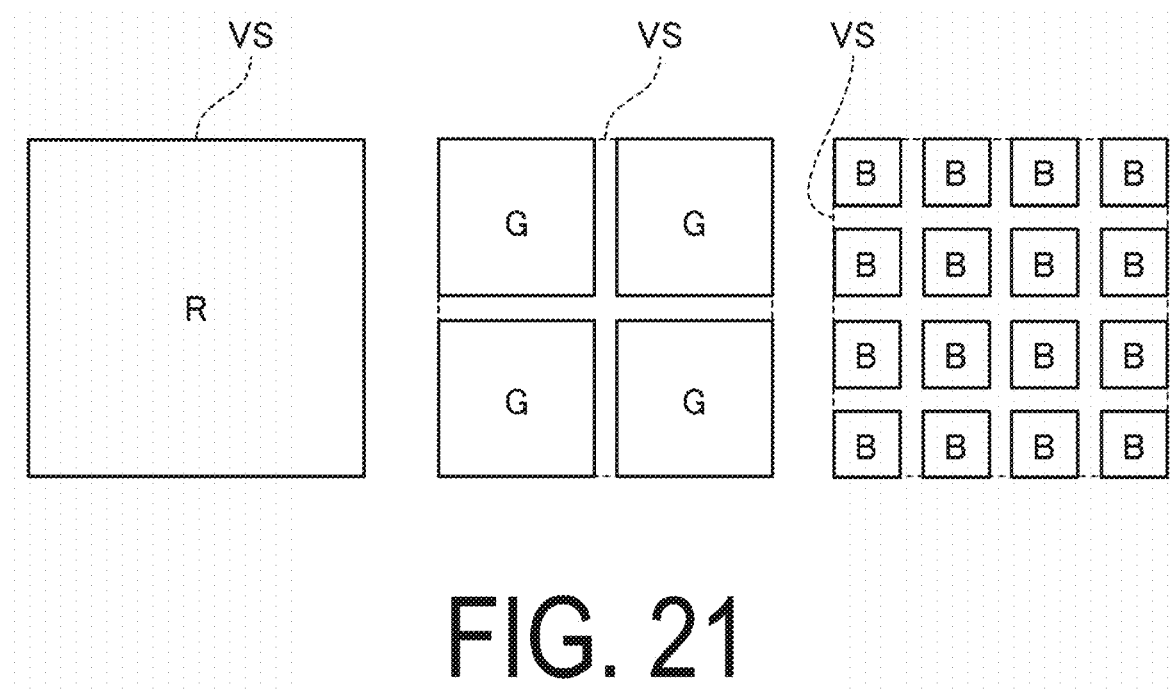
FIG. 21 is a plan view of a light-emitting surface of a red subpixel, a light-emitting surface of green subpixels, and a light-emitting surface of blue subpixels forming the four pixels of the display device of the third embodiment.

FIG. 21 is a top view of a red subpixel R, green subpixels G, and blue subpixels B constituting four pixels of the display device of the present embodiment.

As can be seen from FIG. 21, the single pixel P has one square light-emitting surface of one red light-emitting layer REML, four square light-emitting surfaces of four green light-emitting layers GEML, and sixteen square light-emitting surfaces of sixteen blue light-emitting layers BEML.

As illustrated in FIG. 21, the one square light-emitting surface of the one red light-emitting layer REML matches a virtual square VS. The four square light-emitting surfaces of the four green light-emitting layers GEML are disposed in a matrix in the virtual square VS described above. The four green light-emitting layers GEML are partitioned by the lattice bank BK. The sixteen square light-emitting surfaces of the sixteen blue light-emitting layers BEML are disposed in a matrix in the virtual square VS described above. The sixteen blue light-emitting layers BEML are partitioned by the lattice bank BK.

Also in the present embodiment, the ratio of the area of the shadow of the bank BK formed on the light-emitting surfaces of the blue light-emitting layers BEML to the area of the light-emitting surfaces of the blue light-emitting layers BEML is the same as that in the first embodiment. More specifically, also in the present embodiment, the ratio of the light emitted from the light-emitting surfaces of the blue light-emitting layers BEML and blocked by the light-blocking portion is larger than the ratio of the light emitted from the light-emitting surfaces of the green light-emitting layers GEML and blocked by the light-blocking portion in at least one certain direction out of directions inclined with respect to the reference direction described above. The ratio of the light emitted from the light-emitting surfaces of the green light-emitting layers GEML and blocked by the light-blocking portion is larger than the ratio of the light emitted from the light-emitting surface of the red light-emitting layer REML and blocked by the light-blocking portion in at least one certain direction out of the directions inclined with respect to the reference direction described above.

As described above, all of the light-emitting surfaces of the display device D of the present embodiment are square. Thus, according to the present embodiment, in addition to the effects obtained by the first and the second embodiments, the above-described effect of reducing the difference in tint can be obtained in any of the row direction and the column direction, that is, in any of the lateral direction and the vertical direction.

Fourth Embodiment

A display device D according to a fourth embodiment will be described with reference to FIGS. 22 to 28. Note that redundant description of points is similar to those in the first embodiment will be omitted in the description below. The display device D of the present embodiment differs from the display device D of the first embodiment in the following respects.

The structure of the display device D of the present embodiment will be described with reference to FIGS. 22 to 24.

Figure 22:
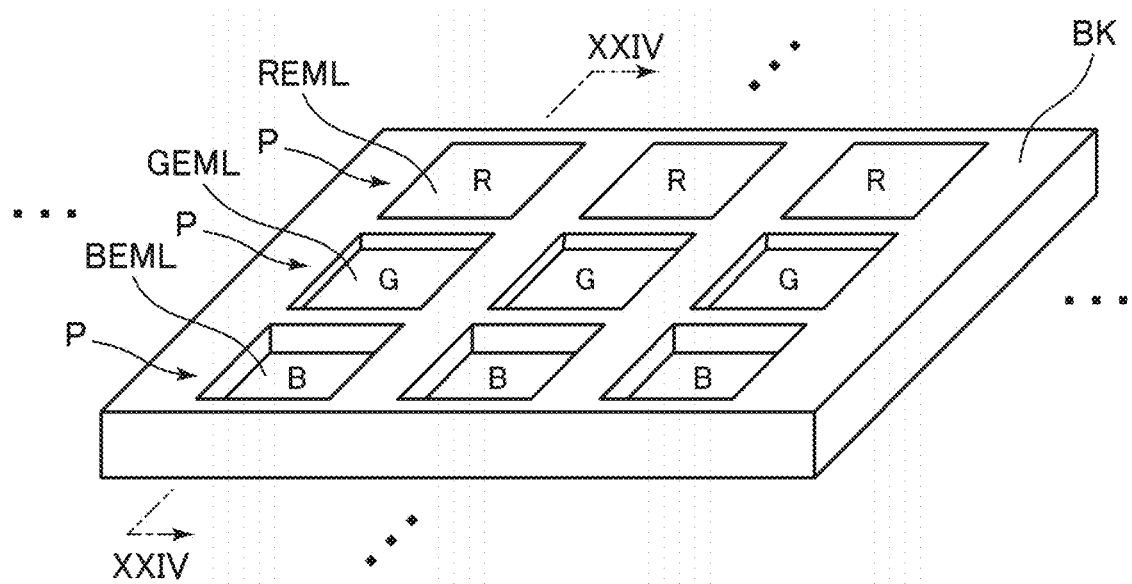
FIG. 22 is a schematic perspective view illustrating a structure of red subpixels, green subpixels, and blue subpixels forming pixels of a display device of a fourth embodiment.

As illustrated in FIG. 22, a blue light-emitting layer BEML has, compared with a green light-emitting layer GEML, a large depth from the top face of the bank BK to the light-emitting surface. The green light-emitting layer GEML has, compared with a red light-emitting layer REML, a large depth from the top face of the bank BK to the light-emitting surface. That is, the following relationship holds: (the distance from the top face of the bank BK to the light-emitting surface of the red light-emitting layer REML)<(the distance from the top face of the bank BK to the light-emitting surface of the green light-emitting layer GEML)<(the distance from the top face of the bank BK to the light-emitting surface of the blue light-emitting layer BEML).

More specifically, the top face of the bank BK and the light-emitting surface of the red light-emitting layer REML are in the same plane. The depth from the top face of the bank BK to the light-emitting surface of the green light-emitting layer GEML is 10 µm. The depth from the top face of the bank BK to the light-emitting surface of the blue light-emitting layer BEML is 20 µm.

Figure 23:
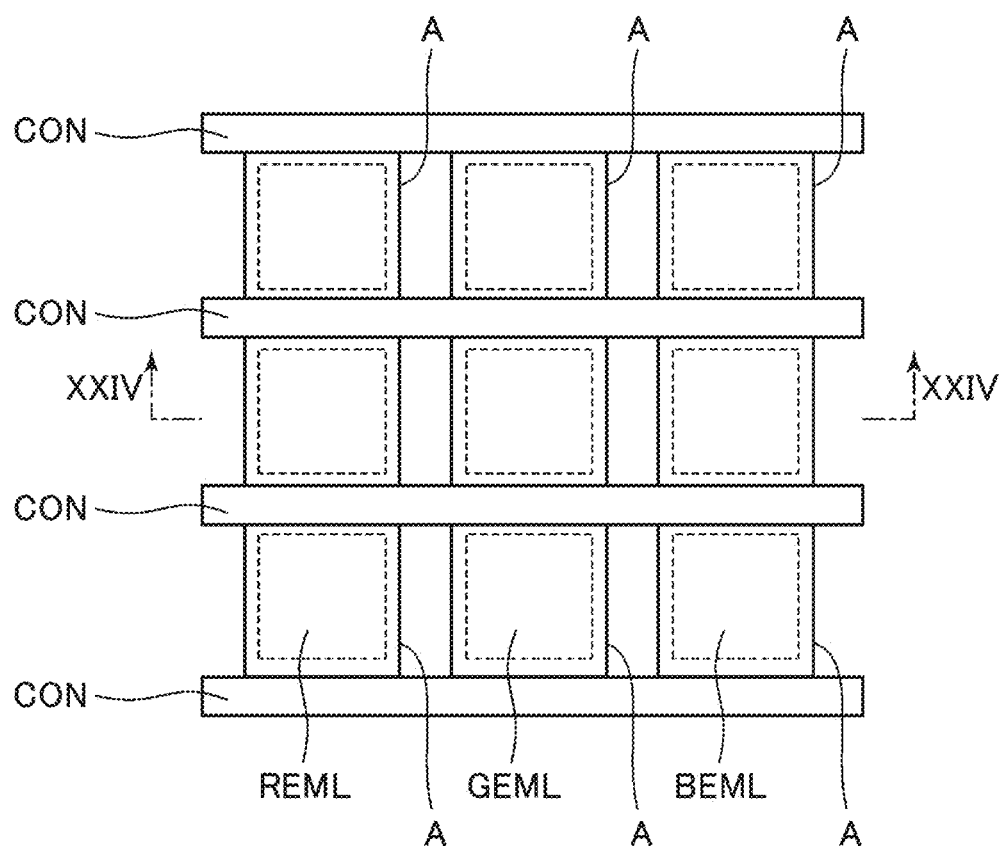
FIG. 23 is a schematic plan view illustrating the structure of the red subpixels, the green subpixels, and the blue subpixels forming the pixels of the display device of the fourth embodiment.

As illustrated in FIG. 23, the light-emitting surface of the red light-emitting layer REML, the light-emitting surface of the green light-emitting layer GEML, and the light-emitting surface of the blue light-emitting layer BEML each have a square shape of the same size, for example, a square shape that is 100 µm long along one side. Thus, the shape and the area of the light-emitting surface of each of the red light-emitting layer REML, the green light-emitting layer GEML, and the blue light-emitting layer BEML are the same. Note that the anodes A are electrically connected to each other by an electrically conductive member CON.

Also in the present embodiment, the ratio of the light emitted from the light-emitting surface of the blue light-emitting layer BEML and blocked by the light-blocking portion is larger than the ratio of the light emitted from the light-emitting surface of the green light-emitting layer GEML and blocked by the light-blocking portion in at least one certain direction out of the directions inclined with respect to the reference direction described above. The ratio of the light emitted from the light-emitting surface of the green light-emitting layer GEML and blocked by the light-blocking portion is larger than the ratio of the light emitted from the light-emitting surface of the red light-emitting layer REML and blocked by the light-blocking portion in at least one certain direction out of the directions inclined with respect to the reference direction described above.

The difference in tint on the display surface DS due to a difference in viewing directions can be reduced using a simple method of setting the depth from the top face of the bank BK to the light-emitting surface of each of the red light-emitting layer REML, the green light-emitting layer GEML, and the blue light-emitting layer BEML different from each other.

Also in the present embodiment, since all of the light-emitting surfaces have a square shape, the difference in tint described above can be reduced in any of the row direction and the column direction. With the display device D of the present embodiment, the difference in tint described above can be reduced in any of the row direction and the column direction without increasing the number of green subpixels G and blue subpixels B with respect to the number of red subpixels R.

Figure 24:
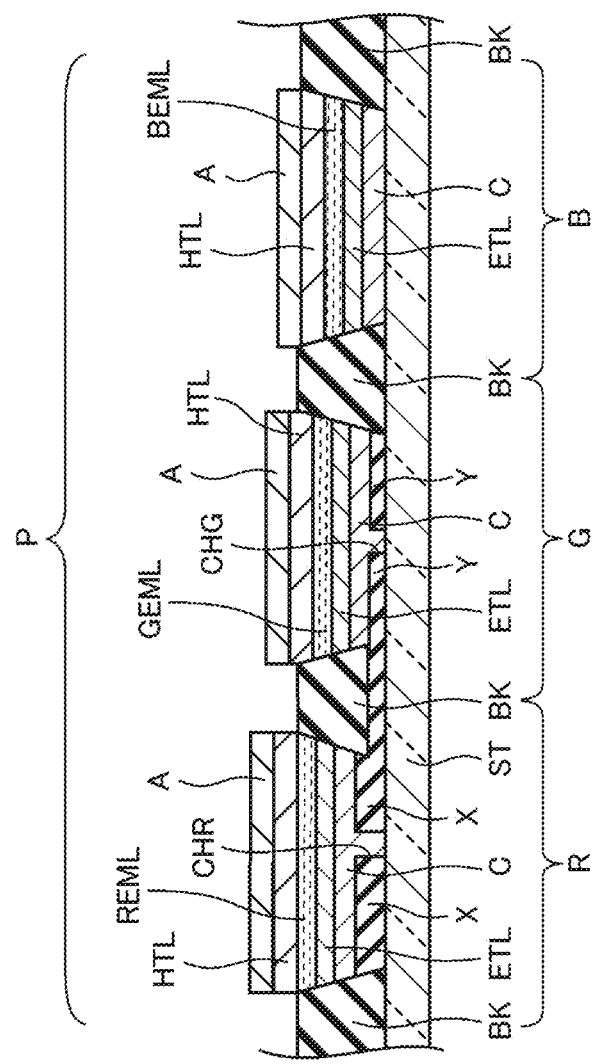
FIG. 24 is a cross-sectional view of part of the display device corresponding to a cross-sectional view taken along line XXIV-XXIV in FIGS. 22 and 23.

As illustrated in FIG. 24, in the red subpixel R, an adjustment layer X, the cathode C, the electron transport layer ETL, the red light-emitting layer REML, the hole transport layer HTL, and the anode A are layered in this order on the substrate ST. The adjustment layer X is disposed between the substrate ST and the electron transport layer ETL. The adjustment layer X has a contact hole CHR across its thickness direction. A part of the cathode C in the contact hole CHR and a TFT for the red subpixel R in the substrate ST are electrically connected.

In the substrate ST and the green subpixel G, an adjustment layer Y, the cathode C, the electron transport layer ETL, the green light-emitting layer GEML, the hole transport layer HTL, and the anode A are layered in this order on the substrate ST. The adjustment layer Y is disposed between the substrate ST and the electron transport layer ETL, and has a smaller thickness than that of the adjustment layer X. The adjustment layer Y has a contact hole CHG across its thickness direction. A part of the cathode C in the contact hole CHG and a TFT in the substrate ST are electrically connected.

In the blue subpixel B, the cathode C, the electron transport layer ETL, the blue light-emitting layer BEML, the hole transport layer HTL, and the anode A are layered in this order on the substrate ST. In the blue subpixel B, no adjustment layer is provided.

Note that also in the present embodiment, the transparent common hole transport layer HTL and the transparent common anode A may be layered in this order to cover the red light-emitting layer REML, the green light-emitting layer GEML, the blue light-emitting layer BEML, and the top face of the bank BK.

In each of the red subpixel R, the green subpixel G, and the blue subpixel B, the heights of the cathode C, the electron transport layer ETL, the light-emitting layer, and the bank BK from the main surface of the substrate ST are the same. Thus, due to the presence of the adjustment layer X and the adjustment layer Y, the depths from the top face of the bank BK to each of the light-emitting surface of the red light-emitting layer REML, the light-emitting surface of the green light-emitting layer GEML, and the light-emitting surface of the blue light-emitting layer BEML are different.

Figure 25:
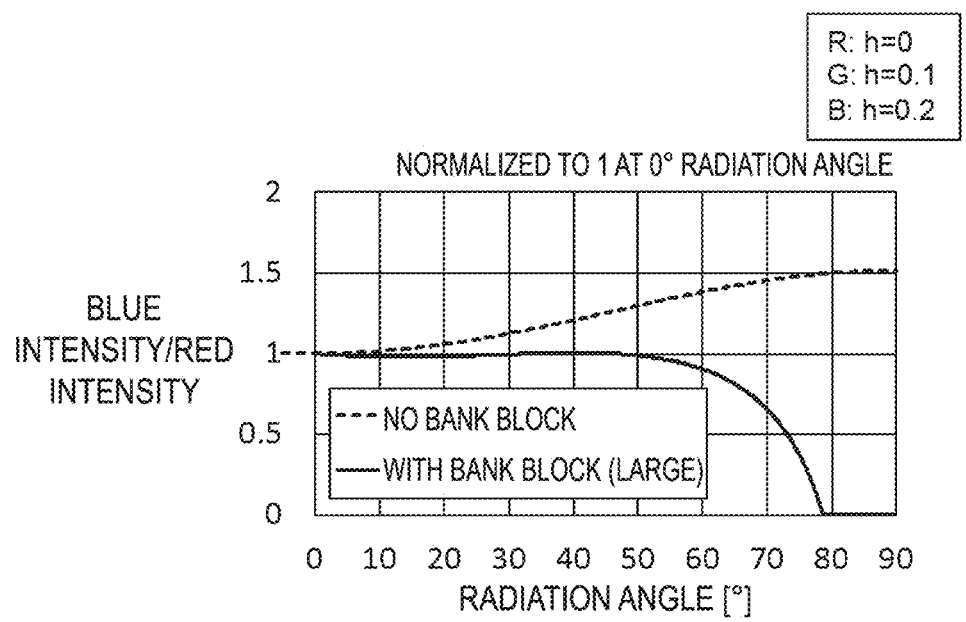
FIG. 25 is a graph illustrating the relationship between the radiation angle of light and a ratio of blue intensity to red intensity of the light in a case of the display device (with bank block (large)) of the fourth embodiment and in a case of a display device (no bank block) of Comparative Example.

FIG. 25 illustrates the relationship between the radiation angle of light and a ratio of blue intensity to red intensity of the light in a case of the display device D (with bank block (large)) of the present embodiment and in a case of a display device (no bank block) of Comparative Example. Values h in FIG. 25 are obtained by (the depth of the bank)/(the length of the light-emitting surface in the lateral direction), that is, (the distance from the light-emitting surface of the blue light-emitting layer BEML to the top face of the bank BK in FIG. 22)/(the length of one side of the light-emitting surface of the blue light-emitting layer BEML along line XXIV-XXIV in FIG. 22).

From FIG. 25, it can be understood that the ratio of the blue intensity to the red intensity of the display device of Comparative Example gradually increases while the radiation angle is in a range from 0° to 90°. On the other hand, it can be understood that the ratio of the blue intensity to the red intensity of the display device D of the present embodiment is substantially the same while the radiation angle is in a range from 0° to about 50°. Thus, it can be understood that a difference between the red intensity and the blue intensity on the display surface DS as viewed along a direction inclined with respect to the reference direction orthogonal to the display surface DS can be reduced.

Figure 26:
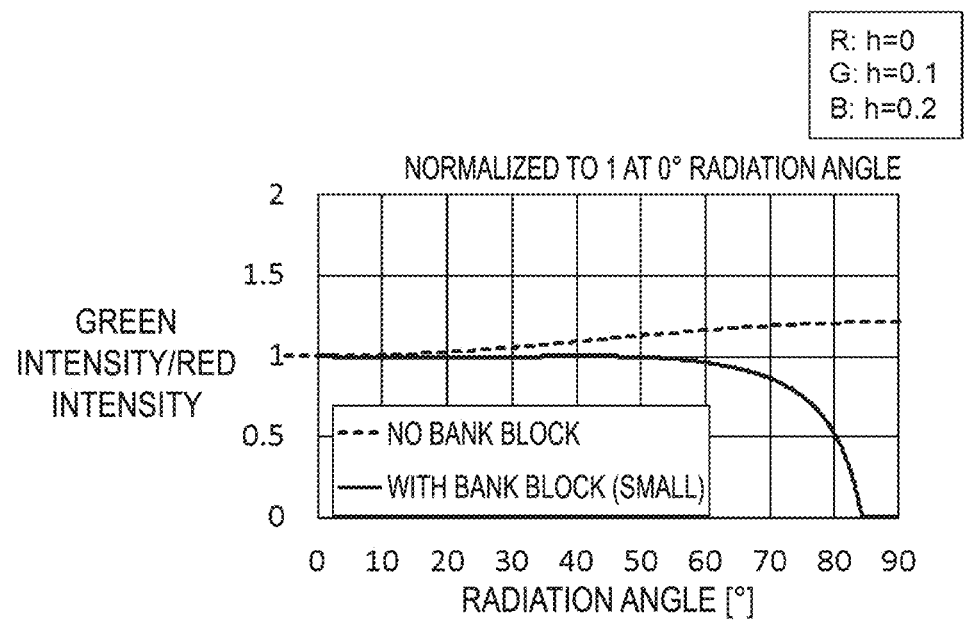
FIG. 26 is a graph illustrating the relationship between the radiation angle of light and a ratio of green intensity to red intensity of the light in a case of the display device (with bank block (small)) of the fourth embodiment and in a case of the display device (no bank block) of Comparative Example.

FIG. 26 illustrates the relationship between the radiation angle of light and a ratio of green intensity to red intensity of the light in a case of the display device D (with bank block (small)) of the present embodiment and in a case of the display device (no bank block) of Comparative Example. Values h in FIG. 26 are obtained by (the height of the light-blocking portion)/(the length of the light-emitting surface in the lateral direction), that is, (the distance from the light-emitting surface of the green light-emitting layer GEML to the top face of the bank BK in FIG. 22)/(the length of one side of the light-emitting surface of the green light-emitting layer GEML along line XXIV-XXIV in FIG. 22).

From FIG. 26, it can be understood that the ratio of the green intensity to the red intensity of the display device of Comparative Example gradually increases while the radiation angle is in a range from 0° to 90°. On the other hand, it can be understood that the ratio of the green intensity to the red intensity of the display device D of the present embodiment is substantially the same while the radiation angle is in a range from 0° to about 55°. Thus, it can be understood that a difference between the red intensity and the green intensity on the display surface DS as viewed along a direction inclined with respect to the reference direction orthogonal to the display surface DS can be reduced.

A method of manufacturing the display device D of the present embodiment will be described with reference to FIGS. 27 and 28.

Figure 27:
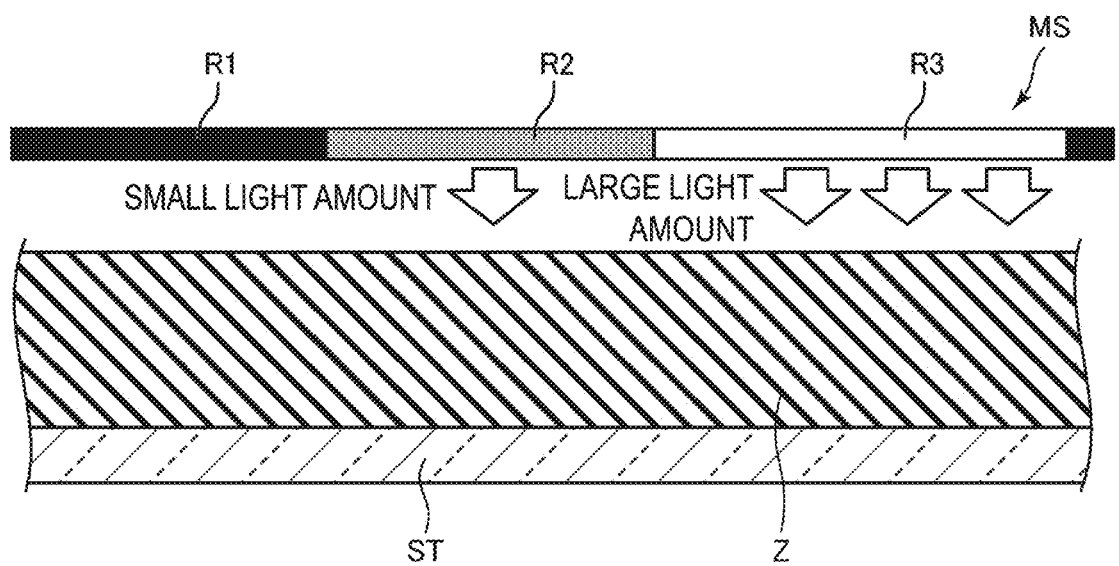
FIG. 27 is a cross-sectional view illustrating a first step of a method of manufacturing the display device of the fourth embodiment.
Figure 28:
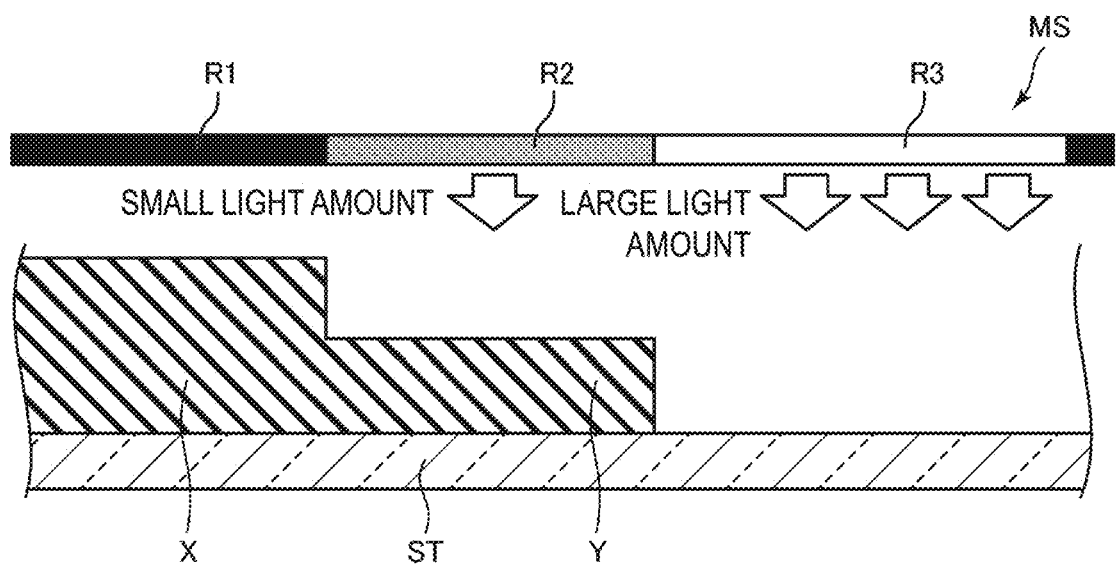
FIG. 28 is a cross-sectional view illustrating a second step of the method of manufacturing the display device of the fourth embodiment.

As illustrated in FIG. 27, a material layer Z having a constant thickness is formed as the raw material constituting the adjustment layer X and the adjustment layer Y on the substrate ST. Next, a photomask MS is installed above the material layer Z disposed on the substrate ST. A first portion R1 of the photomask MS above a region at which the red subpixel R is to be formed has a light transmittance (exposure amount) of zero. A second portion R2 of the photomask MS above a region at which the green subpixel G is to be formed has a light transmittance (exposure amount) of a relatively small value. A third portion R3 of the photomask MS above a region at which the blue subpixel B is to be formed has a light transmittance (exposure amount) of a relatively large value.

In the state illustrated in FIG. 27, the material layer Z is irradiated with light emitted from a light source via the second portion R2 and the third portion R3 of the photomask MS. Next, after an elapse of a prescribed time, a liquid developer is applied to the material layer Z. Thus, as illustrated in FIG. 28, the adjustment layer X and the adjustment layer Y having different thicknesses remain respectively in the region at which the red subpixel R is to be formed and the region at which the green subpixel G is to be formed.

By the method of manufacturing the adjustment layers X and Y of the present embodiment, the depths from the top face of the bank BK to the light-emitting surface can be easily adjusted.

In addition, with the display device D of the present embodiment described above, the areas of the light-emitting surfaces need not be set to be different among the light-emitting layers emitting light of different colors, and thus the emission amounts of the light-emitting layers need not be intentionally set to be different. Thus, the manufacturing method of the light-emitting layers is simplified.

Fifth Embodiment

A display device D according to a fifth embodiment will be described with reference to FIGS. 29 to 32. Note that redundant description of points is similar to those in the first embodiment will be omitted in the description below. The display device D of the present embodiment differs from the display device D of the first embodiment in the following respects.

Figure 29:
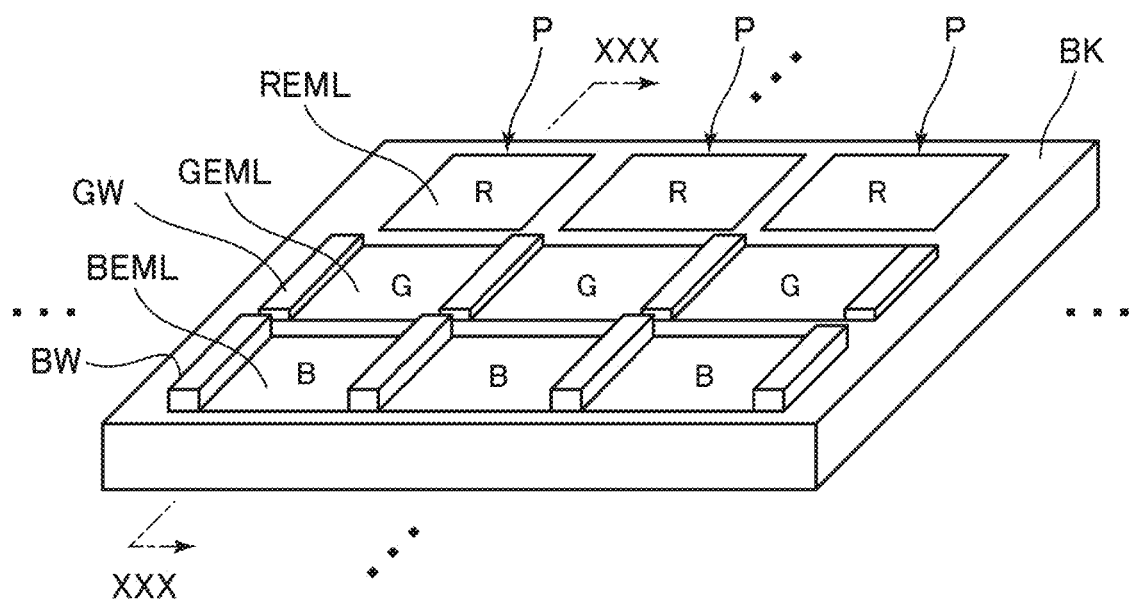
FIG. 29 is a schematic perspective view illustrating a structure of red subpixels, green subpixels, and blue subpixels forming pixels of a display device of a fifth embodiment.
Figure 30:
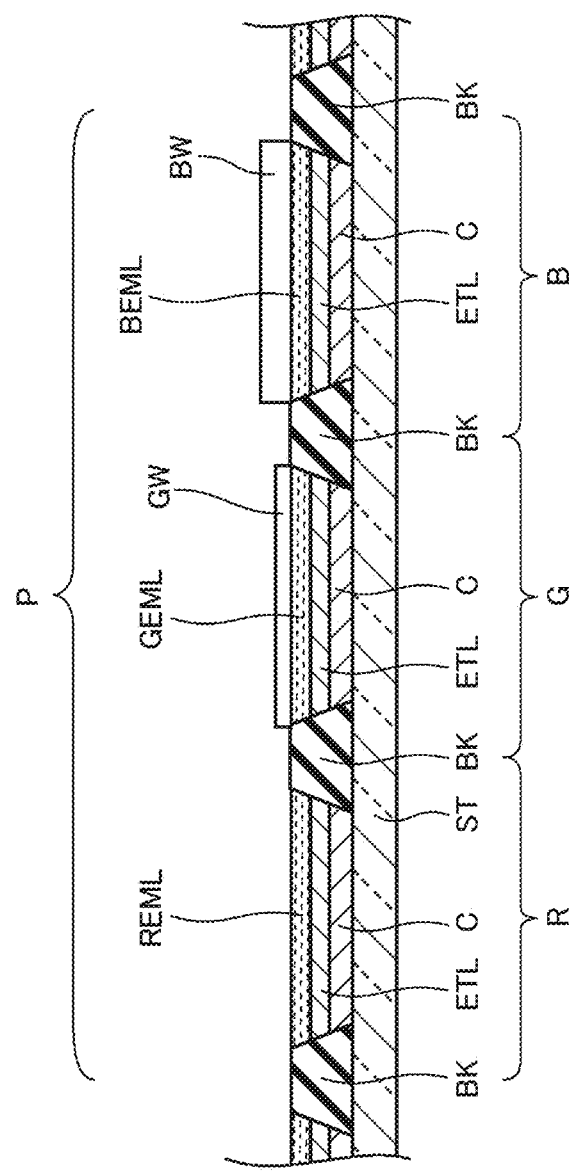
FIG. 30 is a cross-sectional view of part of the display device corresponding to a cross-sectional view taken along line XXX-XXX in FIG. 29.

As illustrated in FIGS. 29 and 30, in the display device D of the present embodiment, the bank BK partitions each of a red light-emitting layer REML, a green light-emitting layer GEML, and a blue light-emitting layer BEML. The top face of the bank BK and the light-emitting surface of each of the red light-emitting layer REML, the green light-emitting layer GEML, and the blue light-emitting layer BEML are in the same virtual plane.

A first wall portion BW is disposed in the periphery of the light-emitting surface of the blue light-emitting layer BEML and on an upper side of the virtual plane including the light-emitting surface of the blue light-emitting layer BEML. A second wall portion GW is disposed in the periphery of the light-emitting surface of the green light-emitting layer GEML and on the upper side of the virtual plane including the light-emitting surface of the green light-emitting layer GEML. The first wall portion BW has, compared with the second wall portion GW, a large height from the light-emitting surface.

More specifically, the first wall portion BW is disposed on the upper side of the top face of the bank BK adjacent to the blue light-emitting layer BEML. The second wall portion GW is disposed on the upper side of the top face of the bank BK adjacent to the green light-emitting layer GEML. No wall portion is disposed on the upper side of the top face of the bank BK adjacent to the red light-emitting layer REML. The first wall portion BW has, compared with the second wall portion GW, a large height from the top face of the bank BK. Note that the top face of the bank BK is included in a virtual plane having the same distance from the main surface (upper side surface) of the substrate ST.

Similar to the bank BK, the first wall portion BW and the second wall portion GW are formed of a material that blocks light, specifically, a material that absorbs or reflects light. Thus, the first wall portion BW and the second wall portion GW, together with the bank BK, function as light-blocking portions that inhibit the traveling of light radiated from the light-emitting surface of the red light-emitting layer REML, the light-emitting surface of the green light-emitting layer GEML, and the light-emitting surface of the blue light-emitting layer BEML.

The first wall portion BW is disposed to extend along one side of the square light-emitting surface of the blue light-emitting layer BEML on the top face of the bank BK adjacent to the blue light-emitting layer BEML. The first wall portion BW functions as a light-blocking portion for the blue light-emitting layer BEML. The first wall portion BW is formed of a material that absorbs or reflects visible light (light having a wavelength of approximately 380 nm to 780 nm).

The second wall portion GW is disposed to extend along one side of the square light-emitting surface of the green light-emitting layer GEML on the top face of the bank BK adjacent to the green light-emitting layer GEML. The second wall portion GW functions as a light-blocking portion for the green light-emitting layer GEML. The second wall portion GW is formed of a material that absorbs or reflects visible light (light having a wavelength of approximately 380 nm to 780 nm).

The first wall portion BW and the second wall portion GW are cuboids having different heights and the same length and width. The height of the first wall portion BW is larger than the height of the second wall portion GW. For example, the height of the first wall portion BW is 20 μm, and the height of the second wall portion GW is 10 μm.

Note that the second wall portion GW may not be provided, that is, the height of the second wall portion GW may be zero.

In the present embodiment, the light-emitting surfaces of the red light-emitting layer REML, the green light-emitting layer GEML, and the blue light-emitting layer BEML have a square shape and have the same area.

Figure 31:
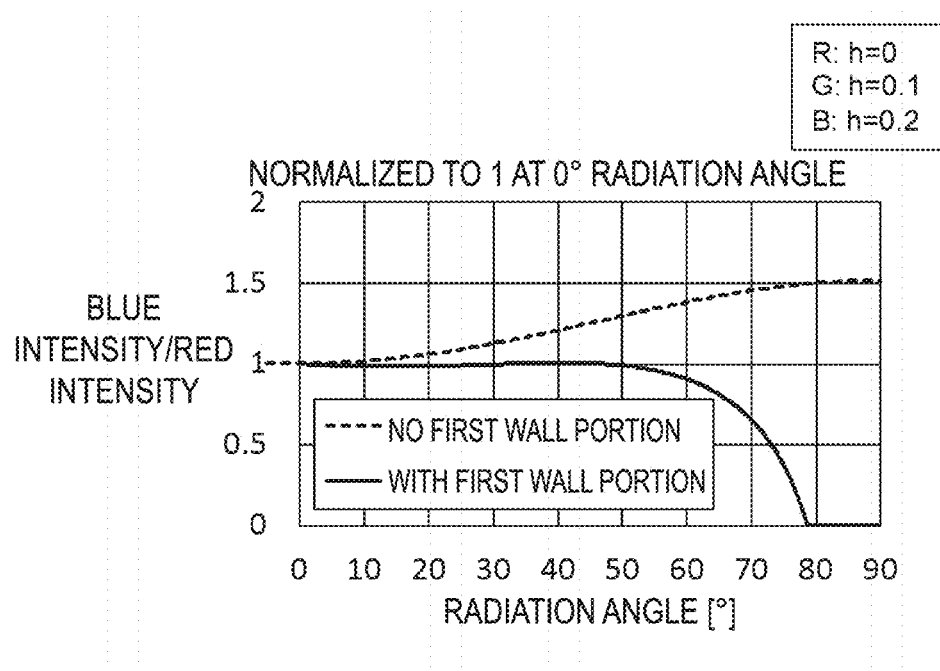
FIG. 31 is a graph illustrating the relationship between the radiation angle of light and the ratio of the blue intensity to the red intensity of the light in a case of the display device (with first wall portion) of the fifth embodiment and in a case of a display device (no first wall portion) of Comparative Example.

FIG. 31 illustrates the relationship between the radiation angle of light and a ratio of blue intensity to red intensity of the light in a case of the display device D (with the first wall portion BW) of the present embodiment and in a case of a display device (without the first wall portion BW) of Comparative Example. Values h in FIG. 31 are obtained by (the height of the light-blocking portion)/(the length of the light-emitting surface in the lateral direction), that is, (the distance from the light-emitting surface of the blue light-emitting layer BEML to the top face of the first wall portion BW in FIG. 29)/(the length of one side of the light-emitting surface of the blue light-emitting layer BEML along line XXX-XXX in FIG. 29).

From FIG. 31, it can be understood that the ratio of the blue intensity to the red intensity of the display device of Comparative Example gradually increases while the radiation angle is in a range from 0° to 90°. On the other hand, it can be understood that the ratio of the blue intensity to the red intensity of the display device D of the present embodiment is substantially the same while the radiation angle is in a range from 0° to about 500. Thus, it can be understood that a difference between the red intensity and the blue intensity on the display surface DS as viewed along a direction inclined with respect to the reference direction orthogonal to the display surface DS can be reduced.

Figure 32:
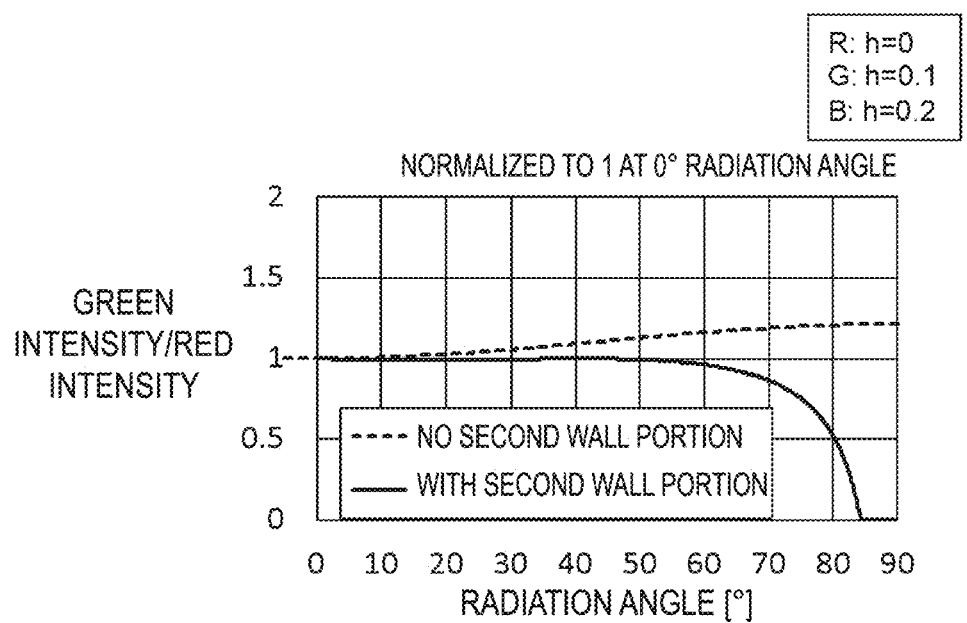
FIG. 32 is a graph illustrating the relationship between the radiation angle of light and the ratio of the green intensity to the red intensity of the light in a case of the display device (with second first wall portion) of the fifth embodiment and in a case of a display device (no second wall portion) of Comparative Example.

FIG. 32 illustrates the relationship between the radiation angle of light and a ratio of green intensity to red intensity of the light in a case of the display device D (with the second wall portion GW) of the present embodiment and in a case of a display device (without the second wall portion GW) of Comparative Example. Values h in FIG. 32 are obtained by (the height of the light-blocking portion)/(the length of the light-emitting surface in the lateral direction), that is, (the distance from the light-emitting surface of the green light-emitting layer GEML to the top face of the second wall portion GW in FIG. 29)/(the length of one side of the light-emitting surface of the green light-emitting layer GEML along line XXX-XXX in FIG. 29).

From FIG. 32, it can be understood that the ratio of the green intensity to the red intensity of the display device of Comparative Example gradually increases while the radiation angle is in a range from 0° to 90°. On the other hand, it can be understood that the ratio of the green intensity to the red intensity of the display device D of the present embodiment is substantially the same while the radiation angle is in a range from 0° to about 55°. Thus, it can be understood that a difference between the red intensity and the green intensity on the display surface DS as viewed along a direction inclined with respect to the reference direction orthogonal to the display surface DS can be reduced.

Also in the present embodiment, the ratio of the light emitted from the light-emitting surface of the blue light-emitting layer BEML and blocked by the light-blocking portion is larger than the ratio of the light emitted from the light-emitting surface of the green light-emitting layer GEML and blocked by the light-blocking portion. The ratio of the light emitted from the light-emitting surface of the green light-emitting layer GEML and blocked by the light-blocking portion is larger than the ratio of the light emitted from the light-emitting surface of the red light-emitting layer REML and blocked by the light-blocking portion.

Thus, also with the display device D of the present embodiment, the difference in tint described above can be reduced in the row direction, that is, in the lateral direction. With the display device D of the present embodiment, the difference in tint on the display surface DS due to a difference in viewing directions can be reduced using a simple method of setting the height of the first wall portion BW and the height of the second wall portion GW different from each other.

Sixth Embodiment

A display device D according to a sixth embodiment will be described with reference to FIGS. 33 to 37. Note that redundant description of points is similar to those in the fifth embodiment will be omitted in the description below. The display device D of the present embodiment differs from the display device D of the fifth embodiment in the following respects.

Figure 33:
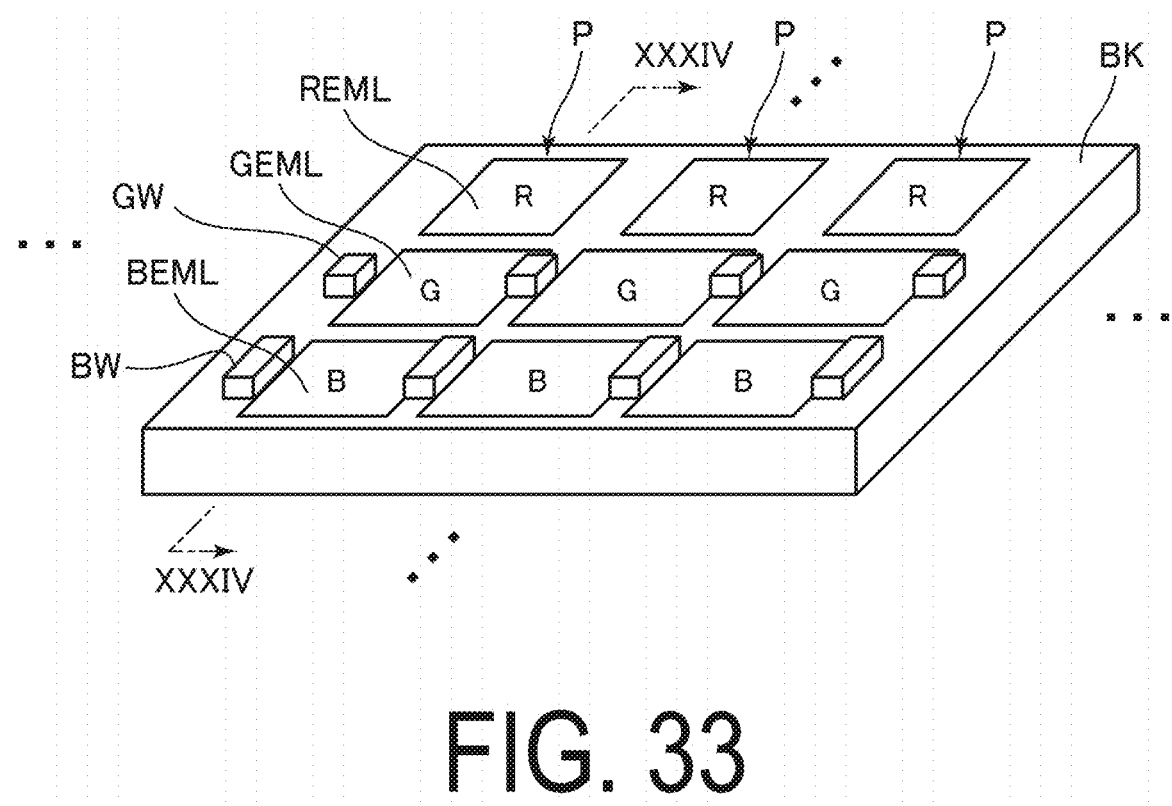
FIG. 33 is a schematic perspective view illustrating a structure of red subpixels, green subpixels, and blue subpixels forming pixels of a display device of a sixth embodiment.
Figure 34:
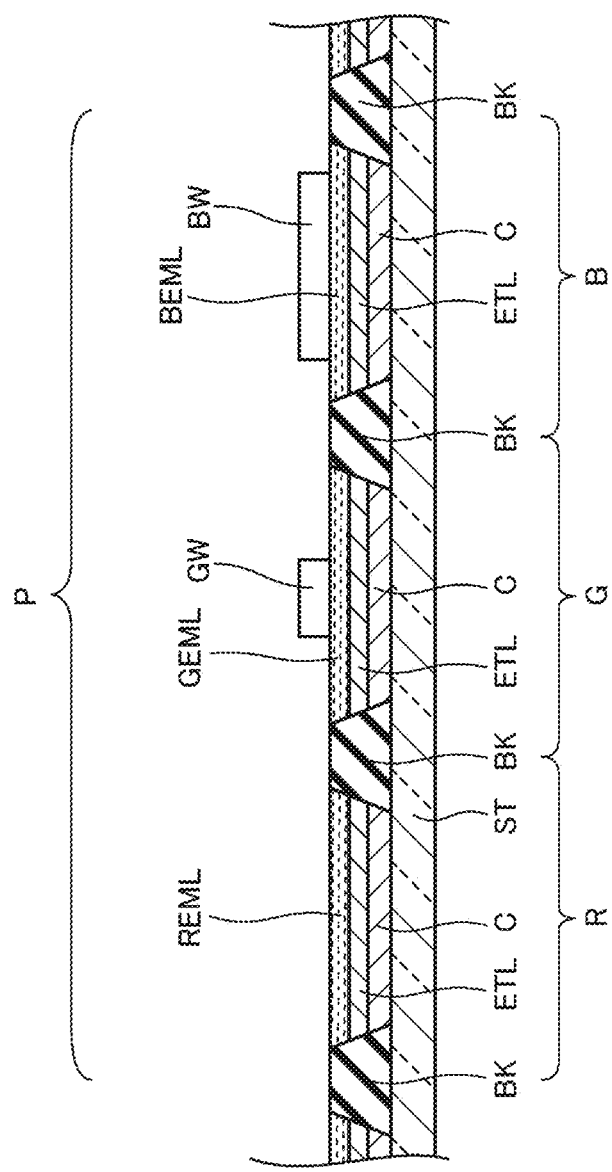
FIG. 34 is a cross-sectional view of part of the display device corresponding to a cross-sectional view taken along line XXXIV-XXXIV in FIG. 33.

As illustrated in FIGS. 33 and 34, also in the display device D of the present embodiment, a first wall portion BW is disposed in the periphery of the light-emitting surface of a blue light-emitting layer BEML and on the upper side of the virtual plane including the light-emitting surface of the blue light-emitting layer BEML as in the case of the display device D of the fifth embodiment. A second wall portion GW is disposed in the periphery of the light-emitting surface of a green light-emitting layer GEML and on the upper side of the virtual plane including the light-emitting surface of the green light-emitting layer GEML.

More specifically, the first wall portion BW and the second wall portion GW are disposed on the upper side of the top face of the bank BK. Note that, also in the present embodiment, the light-emitting surface of a red light-emitting layer REML, the light-emitting surface of the green light-emitting layer GEML, and the light-emitting surface of the blue light-emitting layer BEML all have a square shape and have the same area as in the fifth embodiment.

However, the first wall portion BW and the second wall portion GW of the present embodiment are cuboids having different lengths and the same height (50 μm) and width (50 μm), unlike the first wall portion BW and the second wall portion GW of the fifth embodiment. The length of the first wall portion BW is 34 μm, and is larger than the length of the second wall portion GW, which is 18 μm.

Specifically, compared with the second wall portion GW, the first wall portion BW has the same height but has a large length extending along one side of the square light-emitting surface. Note that the second wall portion GW may not be provided, that is, the length of the second wall portion GW may be zero.

Figure 35:
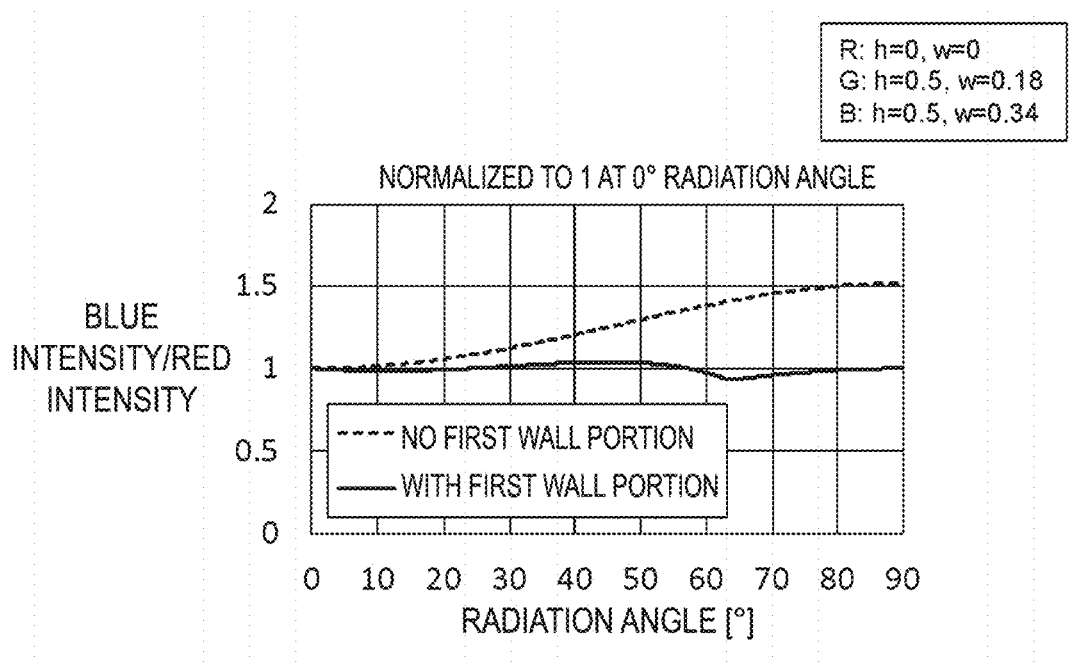
FIG. 35 is a graph illustrating the relationship between the radiation angle of light and the ratio of the blue intensity to the red intensity of the light in a case of the display device (with first wall portion) of the sixth embodiment and in a case of a display device (no first wall portion) of Comparative Example.

FIG. 35 illustrates the relationship between the radiation angle of light and a ratio of blue intensity to red intensity of the light in a case of the display device D (with the first wall portion BW) of the present embodiment and in a case of a display device (without the first wall portion BW) of Comparative Example. Values h in FIG. 35 are obtained by (the height of the light-blocking portion)/(the length of the light-emitting surface of the blue light-emitting layer BEML in the lateral direction), that is, (the distance from the light-emitting surface of the blue light-emitting layer BEML to the top face of the first wall portion BW in FIG. 33)/(the length of one side of the light-emitting surface of the blue light-emitting layer BEML along line XXXIV-XXXIV in FIG. 33). Values w in FIG. 35 are obtained by (the length of the light-blocking portion)/(the length of the light-emitting surface in the vertical direction), that is, (the length of the first wall portion BW along the direction orthogonal to line XXXIV-XXXIV in FIG. 33)/(the length of one side of the light-emitting surface of the blue light-emitting layer BEML along the direction orthogonal to line XXXIV-XXXIV in FIG. 33).

From FIG. 35, it can be understood that the ratio of the blue intensity to the red intensity of the display device of Comparative Example gradually increases while the radiation angle is in a range from 0° to 90°. On the other hand, it can be understood that the ratio of the blue intensity to the red intensity of the display device D of the present embodiment is substantially the same while the radiation angle is in a range from 0° to about 90°. Thus, it can be understood that a difference between the red intensity and the blue intensity on the display surface DS as viewed along a direction inclined with respect to the reference direction orthogonal to the display surface DS can be reduced.

Figure 36:
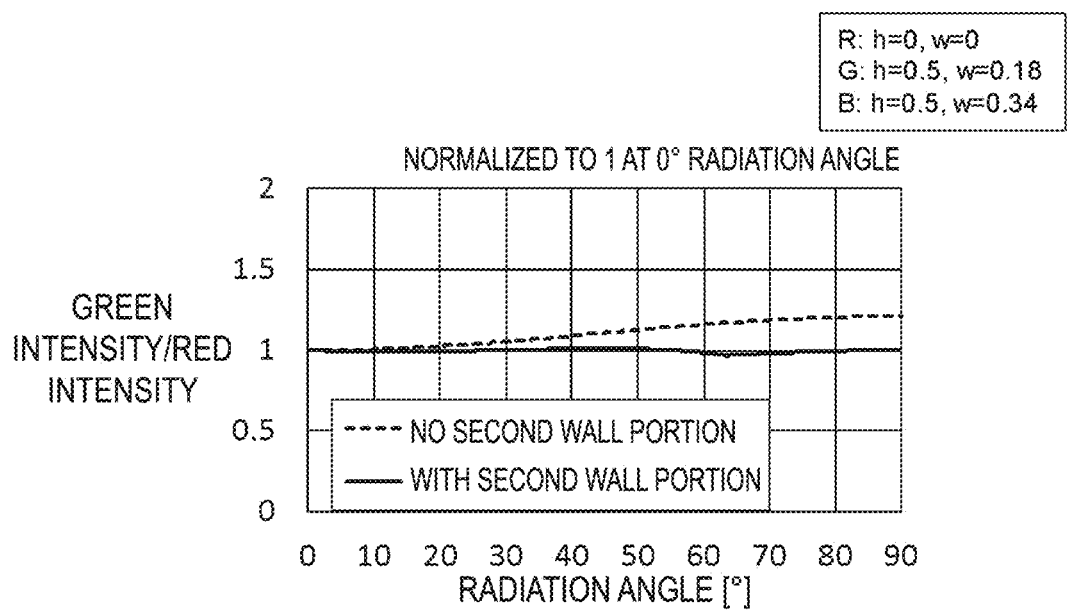
FIG. 36 is a graph illustrating the relationship between the radiation angle of light and the ratio of the green intensity to the red intensity of the light in a case of the display device (with second wall portion) of the sixth embodiment and in a case of a display device (no second wall portion) of Comparative Example.

FIG. 36 illustrates the relationship between the radiation angle of light and a ratio of green intensity to red intensity of the light in a case of the display device D (with the second wall portion GW) of the present embodiment and in a case of a display device (without the second wall portion GW) of Comparative Example. Values h in FIG. 36 are obtained by (the height of the light-blocking portion)/(the length of the light-emitting surface of the green light-emitting layer GEML in the lateral direction), that is, (the distance from the light-emitting surface of the green light-emitting layer GEML to the top face of the second wall portion GW in FIG. 33)/(the length of one side of the light-emitting surface of the green light-emitting layer GEML along line XXXIV-XXXIV in FIG. 33). Values w in FIG. 36 are obtained by (the length of the light-blocking portion)/(the length of the light-emitting surface in the vertical direction), that is, (the length of the second wall portion GW along the direction orthogonal to line XXXIV-XXXIV in FIG. 33)/(the length of one side of the light-emitting surface of the green light-emitting layer GEML along the direction orthogonal to line XXXIV-XXXIV in FIG. 33).

From FIG. 36, it can be understood that the ratio of the green intensity to the red intensity of the display device of Comparative Example gradually increases while the radiation angle is in a range from 0° to 90°. On the other hand, it can be understood that the ratio of the green intensity to the red intensity of the display device D of the present embodiment is substantially the same while the radiation angle is in a range from 0° to about 90°. Thus, it can be understood that a difference between the red intensity and the green intensity on the display surface DS as viewed along a direction inclined with respect to the reference direction orthogonal to the display surface DS can be reduced.

Figure 37:
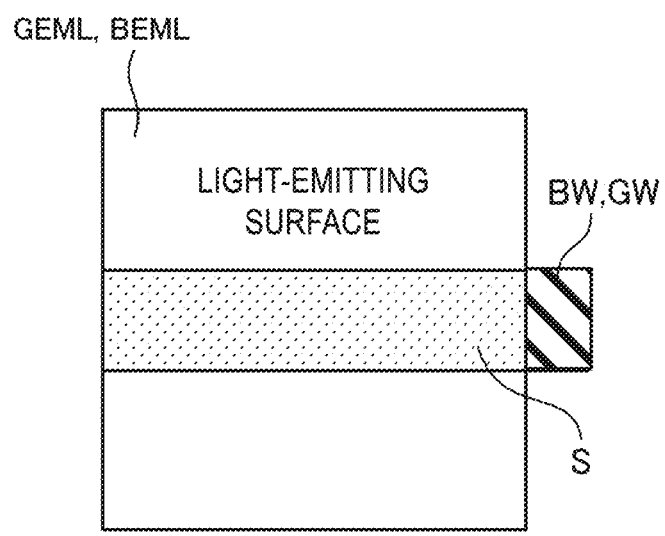
FIG. 37 is a plan view of the light-emitting layer and the light-blocking portion, illustrating the shadow of the light-blocking portion formed on the light-emitting surface of the green light-emitting layer, when light along the first direction inclined with respect to the reference direction orthogonal to the light-emitting surface of the green subpixel is incident on the light-emitting surface in the display device of the sixth embodiment.
Figure 38:
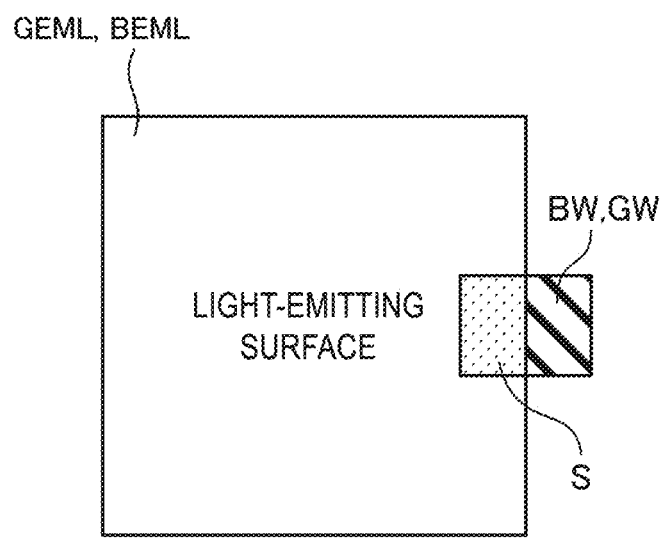
FIG. 38 is a plan view of the light-emitting layer and the light-blocking portion, illustrating the shadow of the light-blocking portion formed on the light-emitting surface of the blue light-emitting layer, when light along the first direction inclined with respect to the reference direction orthogonal to the light-emitting surface of the blue subpixel is incident on the light-emitting surface in the display device of the sixth embodiment.

FIG. 37 illustrates the shadow of the light-blocking portion formed on the light-emitting surface of the blue light-emitting layer BEML, specifically, the shadow of the first wall portion BW, when light along a direction inclined with respect to the reference direction orthogonal to the light-emitting surface is incident on the light-emitting surface. FIG. 38 illustrates the shadow of the light-blocking portion formed on the light-emitting surface of the green light-emitting layer GEML, specifically, the shadow of the second wall portion GW, when light along a direction inclined with respect to the reference direction orthogonal to the light-emitting surface is incident on the light-emitting surface.

As can be seen from comparison between FIG. 37 and FIG. 38, a larger angle of inclination with respect to the reference direction orthogonal to the light-emitting surface leads to a larger shadow of the wall portion, resulting in a larger ratio of the area of the shadow of the wall portion formed on the light-emitting surface to the area of the light-emitting surface.

In other words, also in the present embodiment, the ratio of the light emitted from the light-emitting surface of the blue light-emitting layer BEML and blocked by the light-blocking portion is larger than the ratio of the light emitted from the light-emitting surface of the green light-emitting layer GEML and blocked by the light-blocking portion in at least one certain direction out of directions inclined with respect to the reference direction described above. The ratio of the light emitted from the light-emitting surface of the green light-emitting layer GEML and blocked by the light-blocking portion is larger than the ratio of the light emitted from the light-emitting surface of the red light-emitting layer REML and blocked by the light-blocking portion in at least one certain direction out of the directions inclined with respect to the reference direction described above.

Thus, also with the display device D of the present embodiment, the difference in tint described above can be reduced in the row direction, that is, in the lateral direction. The difference in tint on the display surface DS due to a difference in viewing directions can be reduced using a simple method of setting the length of the first wall portion BW and the length of the second wall portion GW different from each other.

Seventh Embodiment

A display device D according to a seventh embodiment will be described with reference to FIGS. 39 to 51. Note that redundant description of points is similar to those in the first embodiment will be omitted in the description below. The display device D of the present embodiment differs from the display device D of the fifth or the sixth embodiment in the following respects.

Figure 39:
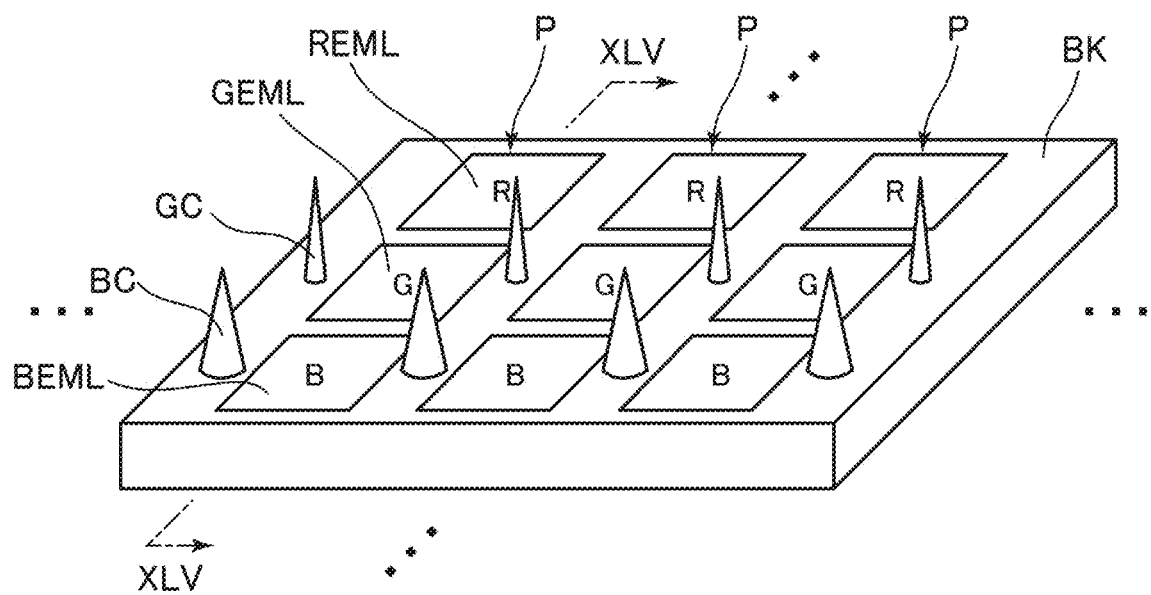
FIG. 39 is a schematic perspective view illustrating a structure of red subpixels, green subpixels, and blue subpixels forming pixels of a display device of a seventh embodiment.

As illustrated in FIG. 39, in the display device D of the present embodiment, a first conical portion BC tapered in a direction away from the bank BK is disposed on the upper side of the bank BK adjacent to a blue light-emitting layer BEML, instead of the first wall portion BW of the fifth or the sixth embodiment. Furthermore, a second conical portion GC tapered in a direction away from the bank BK is disposed on the upper side of the bank BK adjacent to a green light-emitting layer GEML, instead of the second wall portion GW of the fifth or the sixth embodiment.

The first conical portion BC and the second conical portion GC have a conical shape in the present embodiment, but may have a pyramid shape. No conical portion is disposed on the upper side of the bank BK adjacent to a red light-emitting layer REML.

Figure 40:
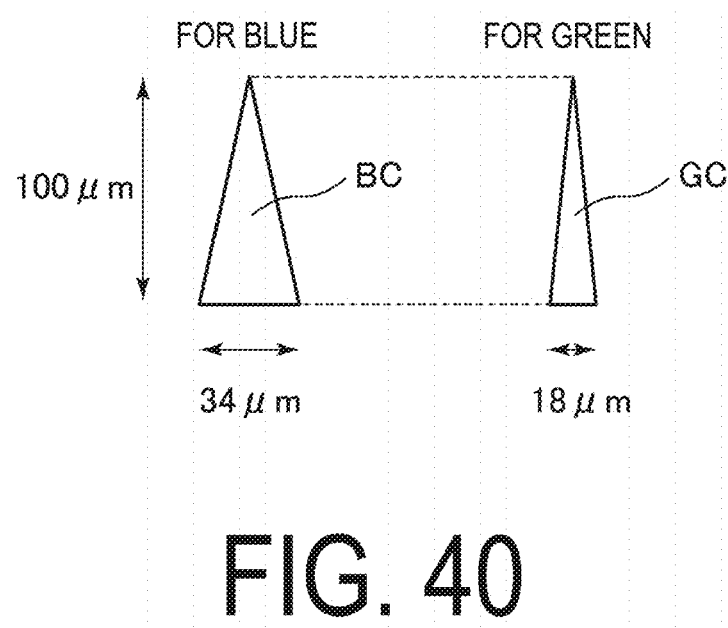
FIG. 40 is a side view of a first conical portion serving as a light-blocking portion for the blue subpixel and a second conical portion serving as a light-blocking portion for the green subpixel in the display device of the seventh embodiment.

The height of the first conical portion BC and the height of the second conical portion GC illustrated in FIGS. 39 and 40 are each 100 µm. The diameter of the circle defining the base of the first conical portion BC is 34 µm, and the diameter of the circle defining the base of the second conical portion GC is 18 µm.

Thus, the first conical portion BC has, compared with the second conical portion GC, a large diameter for the circle defining the base (or large length for one side of the square defining the base). Note that the second conical portion GC may not be provided, and thus the diameter of the circle (or length of one side of the square) defining the base of the second conical portion GC may be zero.

The light-emitting surface of the red light-emitting layer REML, the light-emitting surface of the green light-emitting layer GEML, and the light-emitting surface of the blue light-emitting layer BEML each have a square shape of the same size.

The first conical portion BC and the second conical portion GC are formed of a material that absorbs or reflects light, to form the light-blocking portion, as in the case of the bank BK. Thus, the first conical portion BC and the second conical portion GC, together with the bank BK, function as light-blocking portions that inhibit the traveling of light radiated from the light-emitting surface of the green light-emitting layer GEML and the light-emitting surface of the blue light-emitting layer BEML. The first conical portion BC and the second conical portion GC serving as the light-blocking portions are formed of a material that absorbs or reflects visible light (light having a wavelength of approximately 380 nm to 780 nm).

Figure 41:
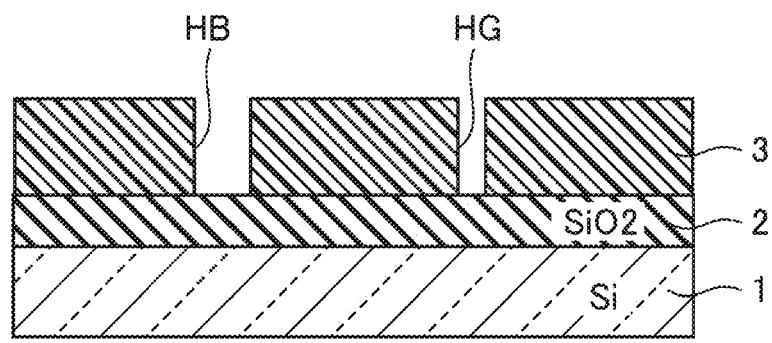
FIG. 41 is a cross-sectional view illustrating a first step of a method of manufacturing the first conical portion serving as the light-blocking portion for the blue subpixel and the second conical portion serving as the light-blocking portion for the green subpixel in the display device of the seventh embodiment.
Figure 42:
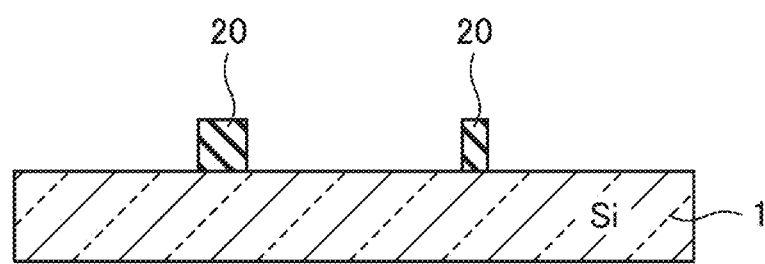
FIG. 42 is a cross-sectional view illustrating a second step of the method of manufacturing the first conical portion serving as the light-blocking portion for the blue subpixel and the second conical portion serving as the light-blocking portion for the green subpixel in the display device of the seventh embodiment.
Figure 43:
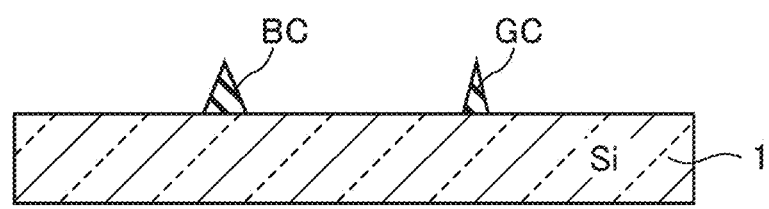
FIG. 43 is a cross-sectional view illustrating a third step of the method of manufacturing the first conical portion serving as the light-blocking portion for the blue subpixel and the second conical portion serving as the light-blocking portion for the green subpixel in the display device of the seventh embodiment.

Referring to FIGS. 41 to 43, a method of manufacturing the first conical portion BC serving as the light-blocking portion for the blue subpixel and the second conical portion GC serving as the light-blocking portion for the green subpixel in the display device D of the present embodiment will be described.

First of all, as illustrated in FIG. 41, a silicon oxide film 2 is formed on a silicon substrate 1. Next, a resist mask 3 is formed on the silicon oxide film 2. Then, contact holes HB and HG are formed in the resist mask 3. As a result, a structure illustrated in FIG. 41 is formed. Next, the silicon oxide film 2 is irradiated with light through the contact holes HB and HG. Then, the resist mask 3 is removed from the silicon oxide film 2.

Next, the silicon oxide film 2 is etched. Thus, part of the silicon oxide film 2 irradiated with light is removed. As a result, as illustrated in FIG. 42, the other part of the silicon oxide film 2 not irradiated with light remains on the silicon substrate 1 as a remaining oxide film 20. Then, dry etching is performed on the remaining oxide film 20. As a result, as illustrated in FIG. 43, the first conical portion BC and the second conical portion GC are formed.

When the first conical portion BC and the second conical portion are formed on the top face of the bank BK, the structure illustrated in FIG. 39 described above is formed. By this manufacturing method, it is possible to form the first conical portion BC and the second conical portion GC with bases having different diameters simply by adjusting the size of each of the contact holes HB and HG.

Figure 44:
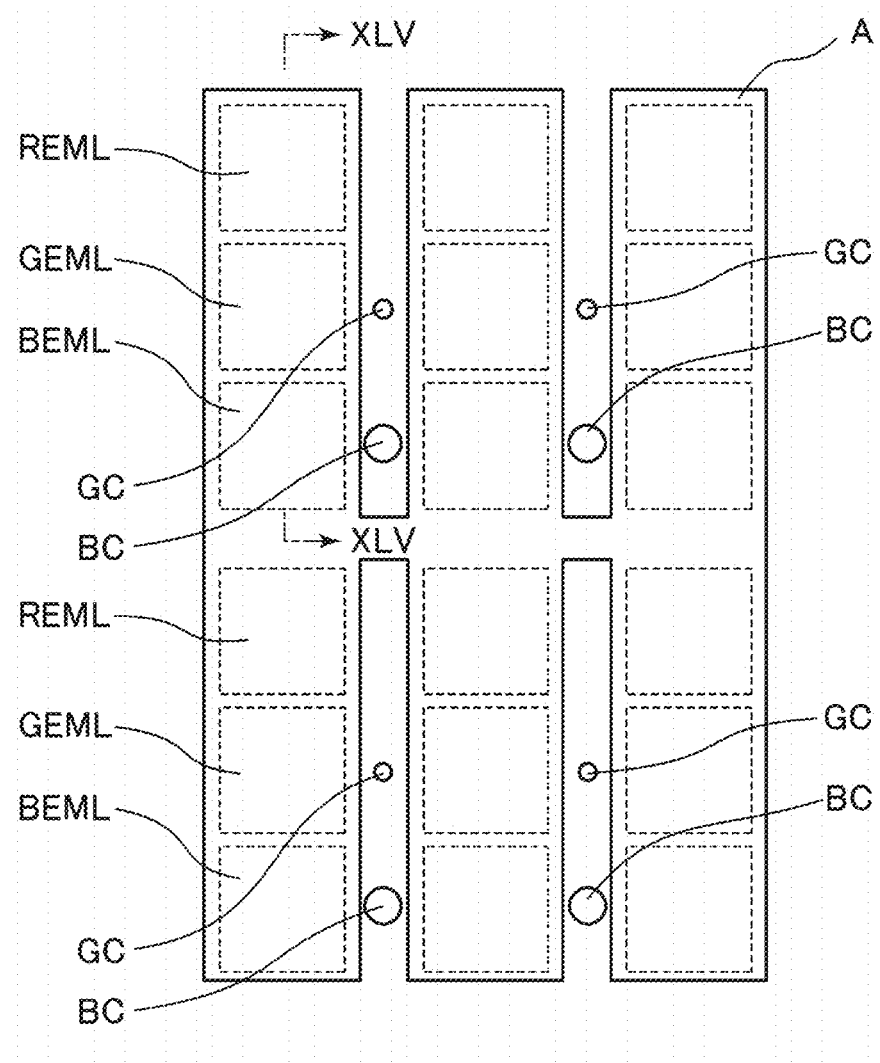
FIG. 44 is a schematic plan view illustrating the structure of the red subpixels, the green subpixels, and the blue subpixels forming the pixels of the display device of the seventh embodiment.

As illustrated in FIG. 44, the anode A serving as the common electrode is disposed at a distance from the first conical portion BC and the second conical portion GC serving as the light-blocking portions, in a direction parallel to the virtual plane extending along the light-emitting surfaces. Thus, in the present embodiment, the anode A is formed at a portion where the first conical portion BC and the second conical portion GC are not formed. Thus, the light-blocking portions do not come into contact with the common electrode, whereby a risk of damaging the light-blocking portions in forming the common electrode is reduced.

Figure 45:
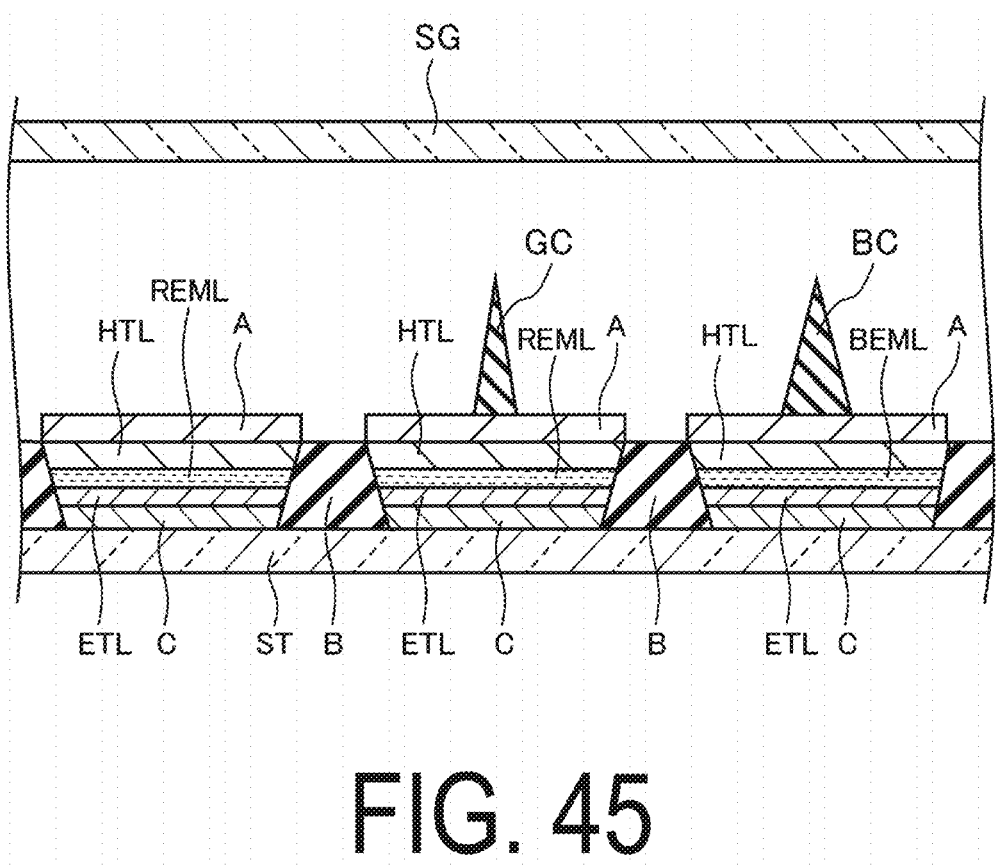
FIG. 45 is a cross-sectional view of part of the display device corresponding to a cross-sectional view taken along line XLV-XLV in FIGS. 39 and 44.

As can be seen in FIGS. 44 and 45, the first conical portion BC is disposed on the bank BK adjacent to a substantially center position of one side of the square light-emitting surface of the blue light-emitting layer BEML. The second conical portion GC is disposed on the bank BK adjacent to a substantially center position of one side of the square light-emitting surface of the green light-emitting layer GEML. The first conical portion BC has, compared with the second conical portion GC, a base having a large diameter. The second conical portion GC has, compared with the first conical portion BC, a base having a small diameter.

Thus, a ratio of the area of the shadow of the second conical portion GC formed on the light-emitting surface of the green light-emitting layer GEML to the area of the light-emitting surface of the green light-emitting layer GEML is smaller than a ratio of the area of the shadow of the first conical portion BC formed on the light-emitting surface of the blue light-emitting layer BEML to the area of the light-emitting surface of the blue light-emitting layer BEML.

Note that in FIG. 45, the thickness of the layered structure from the cathode C to the anode A is 270 nm, and is much smaller than the height of each of the first conical portion BC and the second conical portion GC, which is 100 µm.

Figure 46:
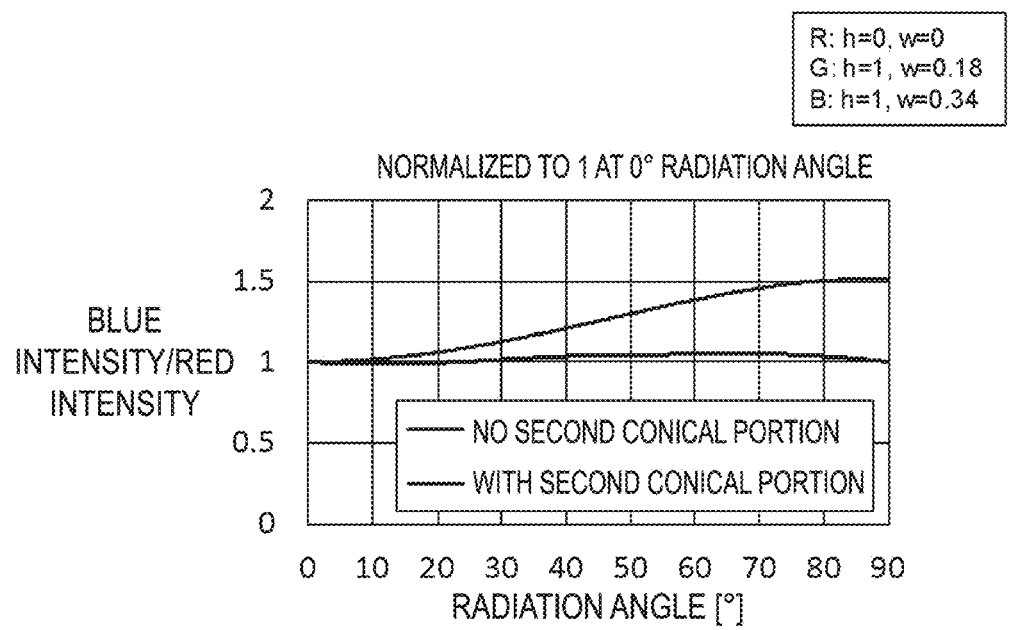
FIG. 46 is a graph illustrating the relationship between the radiation angle of light and the ratio of the blue intensity to the red intensity of the light in a case of the display device (with first conical portion) of the seventh embodiment and in a case of a display device (no first conical portion) of Comparative Example.

FIG. 46 illustrates the relationship between the radiation angle of light and a ratio of green intensity to red intensity of the light in a case of the display device D (with the second conical portion GC) of the present embodiment and in a case of a display device (without the second conical portion GC) of Comparative Example.

From FIG. 46, it can be understood that the ratio of the green intensity to the red intensity of the display device of Comparative Example gradually increases while the radiation angle is in a range from 0° to 90°. On the other hand, it can be understood that the ratio of the green intensity to the red intensity of the display device D of the present embodiment is substantially the same while the radiation angle is in a range from 0° to about 90°. Thus, it can be understood that a difference between the red intensity and the green intensity on the display surface DS as viewed along a direction inclined with respect to the reference direction orthogonal to the display surface DS can be reduced.

Figure 47:
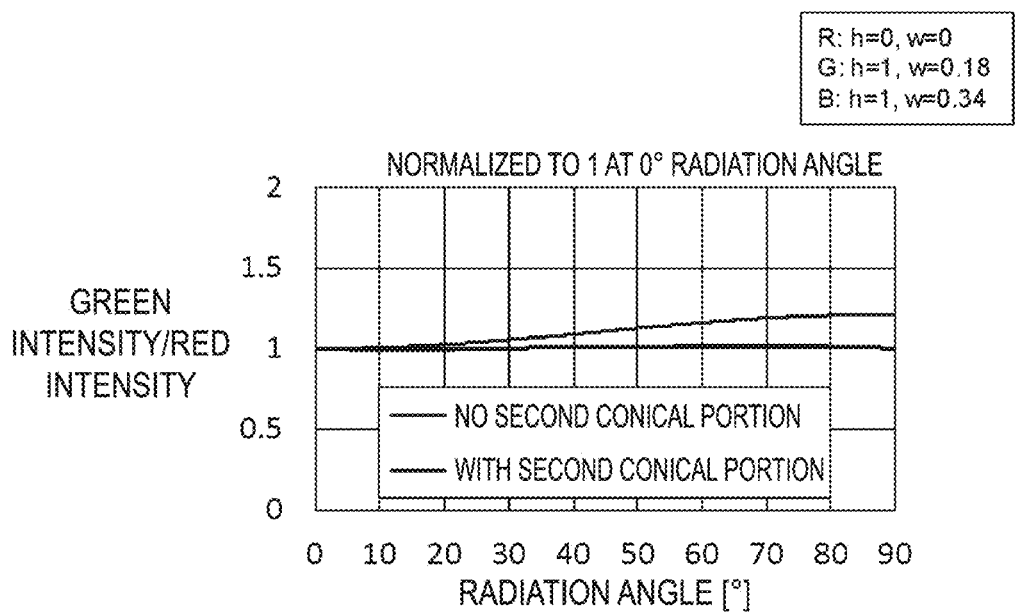
FIG. 47 is a graph illustrating the relationship between the radiation angle of light and the ratio of the green intensity to the red intensity of the light in a case of the display device (with second conical portion) of the seventh embodiment and in a case of a display device (no second conical portion) of Comparative Example.

FIG. 47 illustrates the relationship between the radiation angle of light and a ratio of blue intensity to red intensity of the light in a case of the display device D (with the first conical portion BC) of the present embodiment and in a case of a display device (without the first conical portion BC) of Comparative Example.

From FIG. 47, it can be understood that the ratio of the blue intensity to the red intensity of the display device of Comparative Example gradually increases while the radiation angle is in a range from 0° to 90°. On the other hand, it can be understood that the ratio of the blue intensity to the red intensity of the display device D of the present embodiment is substantially the same while the radiation angle is in a range from 0° to about 90°. Thus, it can be understood that a difference between the red intensity and the blue intensity on the display surface DS as viewed along a direction inclined with respect to the reference direction orthogonal to the display surface DS can be reduced.

Figure 48:
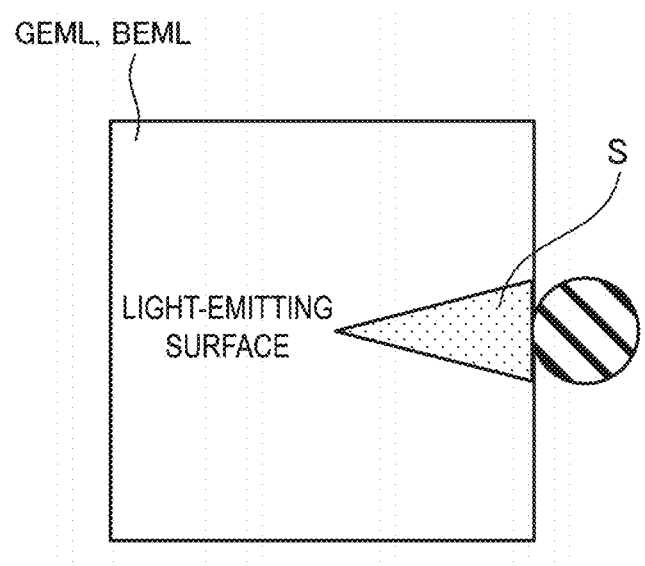
FIG. 48 is a plan view of the light-emitting layer and the light-blocking portion, illustrating a first shadow of a conical portion formed on the light-emitting surface, when light along the first direction inclined with respect to the reference direction orthogonal to the light-emitting surface is incident on the light-emitting surface in the display device of the seventh embodiment.
Figure 49:
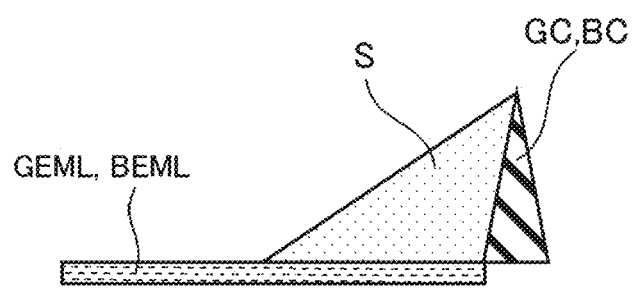
FIG. 49 is a cross-sectional view of the light-emitting layer and the light-blocking portion, illustrating a second shadow of the conical portion formed on the light-emitting surface, when light along the first direction inclined with respect to the reference direction orthogonal to the light-emitting surface is incident on the light-emitting surface in the display device of the seventh embodiment.
Figure 50:
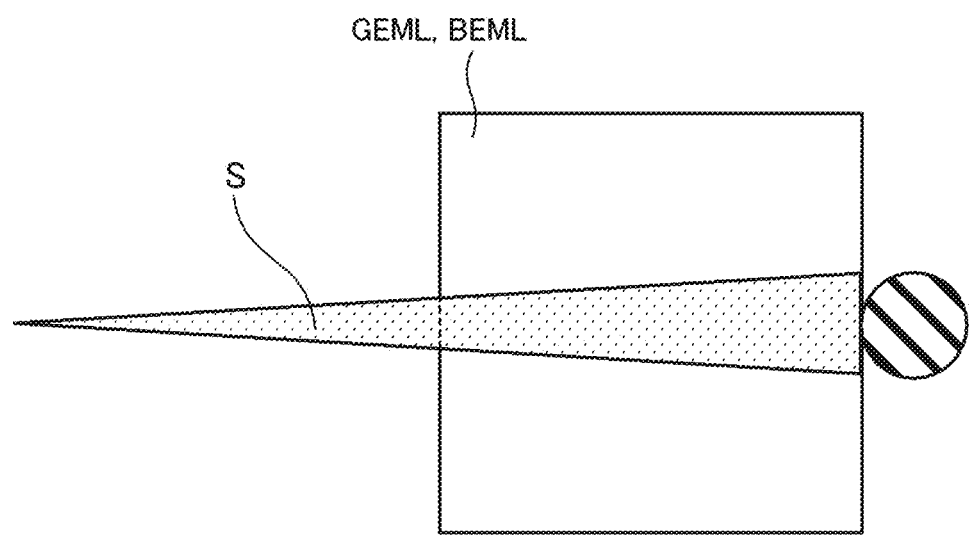
FIG. 50 is a plan view of the light-emitting layer and the light-blocking portion, illustrating a second shadow of the conical portion formed on the light-emitting surface, when light along a second direction inclined with respect to the reference direction orthogonal to the light-emitting surface is incident on the light-emitting surface in the display device of the seventh embodiment.
Figure 51:
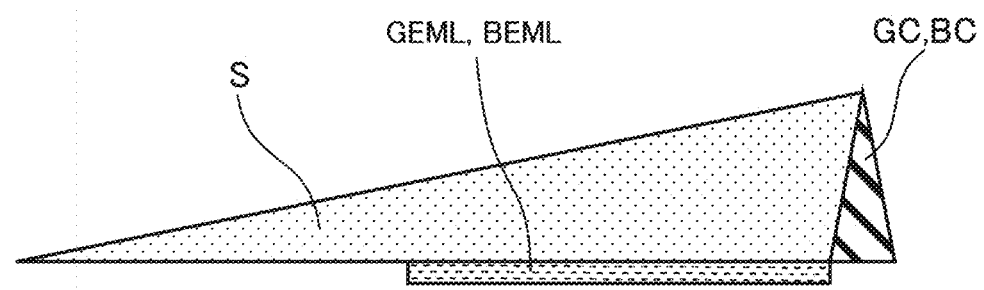
FIG. 51 is a cross-sectional view of the light-emitting layer and the light-blocking portion, illustrating the second shadow of the conical portion formed on the light-emitting surface, when light along the second direction inclined with respect to the reference direction orthogonal to the light-emitting surface is incident on the light-emitting surface in the display device of the seventh embodiment.

FIGS. 48 and 49 illustrate a first shadow S of the conical portion formed on the light-emitting surface, when light along the first direction inclined with respect to the reference direction orthogonal to the light-emitting surface is incident on the light-emitting surface, in the display device D of the present embodiment. FIGS. 50 and 51 illustrate a second shadow of the conical portion formed on the light-emitting surface, when light along the second direction inclined with respect to the reference direction orthogonal to the light-emitting surface is incident on the light-emitting surface, in the display device D of the present embodiment.

As can be seen from comparison between FIGS. 48 and 49 and FIGS. 50 and 51, a larger angle between the reference direction orthogonal to the light-emitting surface and a direction inclined with respect to the reference direction leads to a larger shadow of the conical portion, This results in a larger ratio of the area of the shadow of the conical portion formed on the light-emitting surface to the area of the light-emitting surface.

Thus, also in the present embodiment, the ratio of the light emitted from the light-emitting surface of the blue light-emitting layer BEML and blocked by the light-blocking portion is larger than the ratio of the light emitted from the light-emitting surface of the green light-emitting layer GEML and blocked by the light-blocking portion in at least one certain direction out of the directions inclined with respect to the reference direction described above. The ratio of the light emitted from the light-emitting surface of the green light-emitting layer GEML and blocked by the light-blocking portion is larger than the ratio of the light emitted from the light-emitting surface of the red light-emitting layer REML and blocked by the light-blocking portion in at least one certain direction out of the directions inclined with respect to the reference direction described above. Thus, also with the display device D of the present embodiment, the difference in tint described above can be reduced in the row direction, that is, in the lateral direction.

With the display device D of the present embodiment, the difference in tint on the display surface DS due to a difference in viewing directions can be reduced using a simple method of setting the diameter of the circle defining the base of the first conical portion BC and the diameter of the circle defining the base of the second conical portion GC different from each other.

Eighth Embodiment

Figure 52:
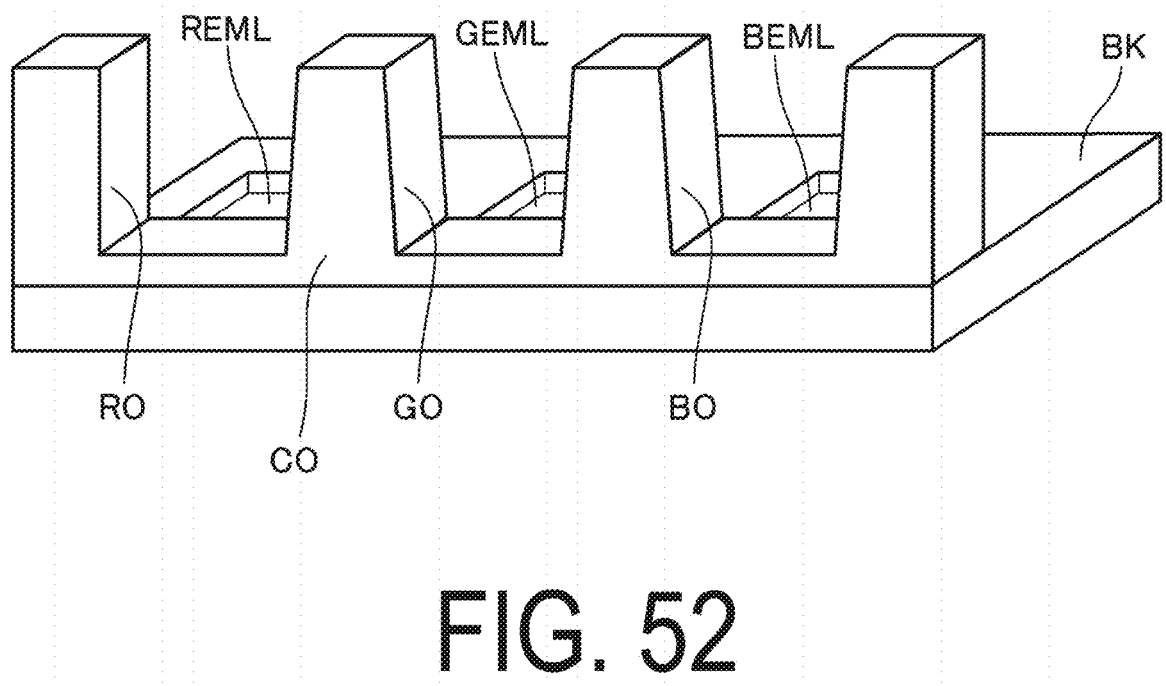
FIG. 52 is a schematic perspective view illustrating a structure of a red subpixel, a green subpixel, and a blue subpixel forming a pixel of a display device of an eighth embodiment.

A display device D according to an eighth embodiment will be described with reference to FIG. 52. Note that redundant description of points similar to those in the fifth embodiment will be omitted in the description below. The display device D of the present embodiment differs from the display device D of the fifth embodiment in the following respects.

The display device D includes a comb-shaped portion CO disposed on the upper side of the top face of the bank BK adjacent to a red light-emitting layer REML, a green light-emitting layer GEML, and a blue light-emitting layer BEML, the comb-shaped portion CO having one or more notches, for example, three notches, each open toward the side opposite to the bank BK. The comb-shaped portion CO functions as a light-blocking portion that inhibits the traveling of light emitted from each of the red light-emitting layer REML, the green light-emitting layer GEML, and the blue light-emitting layer BEML. The comb-shaped portion CO serving as the light-blocking portion is formed of a material that absorbs or reflects visible light (light having a wavelength of approximately 380 nm to 780 nm).

The following relationship holds: (the area of the region in a notch RO corresponding to the red light-emitting layer REML)>(the area of the region in a notch GO corresponding to the green light-emitting layer GEML)>(the area of the region in a notch BO corresponding to the blue light-emitting layer BEML). Note that, also in the present embodiment, the light-emitting surface of a red light-emitting layer REML, the light-emitting surface of the green light-emitting layer GEML, and the light-emitting surface of the blue light-emitting layer BEML all have a square shape and have the same area as in the fifth embodiment.

Also in the present embodiment, the ratio of the light emitted from the light-emitting surface of the blue light-emitting layer BEML and blocked by the light-blocking portion is larger than the ratio of the light emitted from the light-emitting surface of the green light-emitting layer GEML and blocked by the light-blocking portion in at least one certain direction out of the directions inclined with respect to the reference direction described above. The ratio of the light emitted from the light-emitting surface of the green light-emitting layer GEML and blocked by the light-blocking portion is larger than the ratio of the light emitted from the light-emitting surface of the red light-emitting layer REML and blocked by the light-blocking portion in at least one certain direction out of the directions inclined with respect to the reference direction described above. Thus, also with the display device D of the present embodiment, the difference in tint described above can be reduced in the row direction, that is, in the lateral direction.

The difference in tint on the display surface DS due to a difference in viewing directions can be reduced using a simple method of setting the areas of the regions of the three respective notches corresponding to the red light-emitting layer REML, the green light-emitting layer GEML, and the blue light-emitting layer BEML different from each other.

With the display device D of the present embodiment, the comb-shaped portion CO can be formed by simply processing a plate member. Thus, detailed processing for the wall portions or the conical portions as described in the above embodiments is not required. Thus, the display device D can be easily manufactured.

Ninth Embodiment

Figure 53:
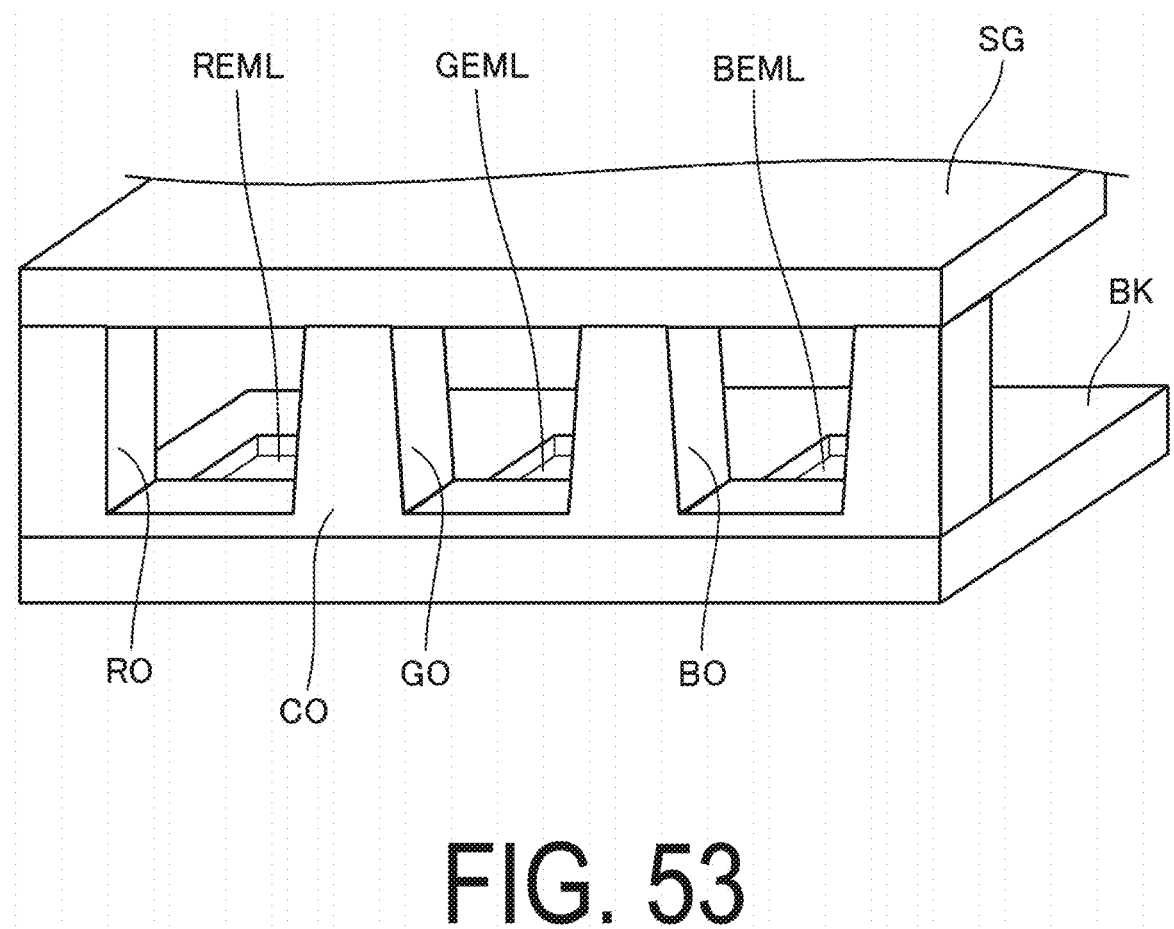
FIG. 53 is a schematic perspective view illustrating a structure of a red subpixel, a green subpixel, and a blue subpixel forming a pixel of a display device of a ninth embodiment.

A display device D according to a ninth embodiment will be described with reference to FIG. 53. Note that redundant description of points is similar to those in the eighth embodiment will be omitted in the description below. The display device D of the present embodiment differs from the display device D of the eighth embodiment in the following respects.

The display device D further includes a transparent plate SG disposed at a distance from the bank BK above the top face of the bank BK. The comb-shaped portion CO is fixed to the transparent plate SG. Also with the display device D of the present embodiment, the difference in tint described above can be reduced in the row direction, that is, in the lateral direction, as in the display device D of the eighth embodiment.

The comb-shaped portion CO functions as a spacer between the bank BK and the transparent plate SG. Thus, a state where the distance between the transparent plate SG and the bank BK is of a predetermined value or more can be maintained.

The invention claimed is:

1. A display device comprising:
a plurality of light-emitting layers, each configured to emit light in a reference direction orthogonal to a light-emitting surface; and
a light-blocking portion configured to block a part of light traveling from the light-emitting surface in inclined directions that are inclined with respect to the reference direction,
wherein the plurality of light-emitting layers includes a first light-emitting layer configured to emit light with a first peak wavelength and a second light-emitting layer configured to emit light with a second peak wavelength that is longer than the first peak wavelength,
the first light-emitting layer has, compared to the second light-emitting layer, a larger ratio of the part of light blocked by the light-blocking portion to light traveling in at least one certain direction out of the inclined directions,
the light-emitting surface of each of the first light-emitting layer and the second light-emitting layer has a square shape,
the light-blocking portion includes:
a first wall portion disposed in a periphery of the light-emitting surface of the first light-emitting layer and on an upper side of a virtual plane including the light-emitting surface of the first light-emitting layer, and
a second wall portion disposed in a periphery of the light-emitting surface of the second light-emitting layer and on an upper side of a virtual plane including the light-emitting surface of the second light-emitting layer, and
the first wall portion has, compared to the second wall portion, a larger length extending along the light-emitting surface.

2. The display device according to claim 1,
wherein the light-blocking portion further includes a bank that partitions each of the first light-emitting layer and the second light-emitting layers, and that protrudes upward beyond the light-emitting surface, and
an area of the light-emitting surface of the first light-emitting layer is smaller than an area of the light-emitting surface of the second light-emitting layer.

3. The display device according to claim 1,
wherein in each pixel, a number of first light-emitting layers is larger than a number of second light-emitting layers.

4. The display device according to claim 1,
wherein the light-blocking portion further includes a bank that partitions each of the first light-emitting layer and the second light-emitting layers, and that protrudes upward beyond the light-emitting surface, and
the first light-emitting layer has, compared to the second light-emitting layer, a larger depth from a top face of the bank to the light-emitting surface.

5. The display device according to claim 1, wherein the first wall portion further has, compared to the second wall portion, a larger height from the light-emitting surface.

6. The display device according to claim 1, further comprising a common electrode configured to supply charge to each of the first light-emitting layer and the second light-emitting layer, or to be supplied with charge from each of the first light-emitting layer and the second light-emitting layer,
wherein the common electrode is disposed, at a distance from the light-blocking portion, in a direction parallel to the virtual planes extending along the light-emitting surfaces.

7. The display device according to claim 1,
wherein the light-blocking portion is formed of a material that absorbs visible light.

8. The display device according to claim 1, further comprising a transparent common charge transport layer configured to transport charge to each of the plurality of light-emitting layers, or to receive charge transported from the plurality of light-emitting layers.

9. A display device comprising:
a plurality of light-emitting layers, each configured to emit light in a reference direction orthogonal to a light-emitting surface; and
a light-blocking portion configured to block a part of light traveling from the light-emitting surface in inclined directions that are inclined with respect to the reference direction,
wherein the plurality of light-emitting layers includes a first light-emitting layer configured to emit light with a first peak wavelength and a second light-emitting layer configured to emit light with a second peak wavelength that is longer than the first peak wavelength,
the first light-emitting layer has, compared to the second light-emitting layer, a larger ratio of the part of light blocked by the light-blocking portion to light traveling in at least one certain direction out of the inclined directions,
the light-blocking portion includes:
a first wall portion disposed in a periphery of the light-emitting surface of the first light-emitting layer and on an upper side of a virtual plane including the light-emitting surface of the first light-emitting layer, and
a second wall portion disposed in a periphery of the light-emitting surface of the second light-emitting layer and on an upper side of a virtual plane including the light-emitting surface of the second light-emitting layer,
the first wall portion has, compared to the second wall portion, a larger height from the light-emitting surface, and
the first wall portion further has, compared to the second wall portion, a larger length extending along the light-emitting surface.

10. A display device comprising:
a plurality of light-emitting layers, each configured to emit light in a reference direction orthogonal to a light-emitting surface; and
a light-blocking portion configured to block a part of light traveling from the light-emitting surface in inclined directions that are inclined with respect to the reference direction,
wherein the plurality of light-emitting layers includes a first light-emitting layer configured to emit light with a first peak wavelength and a second light-emitting layer configured to emit light with a second peak wavelength that is longer than the first peak wavelength,
the first light-emitting layer has, compared to the second light-emitting layer, a larger ratio of the part of light blocked by the light-blocking portion to light traveling in at least one certain direction out of the inclined directions, the light-emitting surface of each of the first light-emitting layer and the second light-emitting layer has a square shape, the light-blocking portion includes:
- a first conical portion disposed in a periphery of the light-emitting surface of the first light-emitting layer and on an upper side of a virtual plane including the light-emitting surface of the first light-emitting layer, the first conical portion being tapered in a direction away from the light-emitting surface, and
- a second conical portion disposed in a periphery of the light-emitting surface of the second light-emitting layer and on an upper side of a virtual plane including the light-emitting surface of the second light-emitting layer, the second conical portion being tapered in the direction away from the light-emitting surface, and the first conical portion has, compared to the second conical portion, a base having a larger diameter or having a larger length along a side of the base.

11. The display device according to claim 10,
wherein the light-blocking portion further includes a bank that partitions each of the first light-emitting layer and the second light-emitting layer and that protrudes upward beyond the light-emitting surface, and an area of the light-emitting surface of the first light-emitting layer is smaller than an area of the light-emitting surface of the second light-emitting layer.

12. The display device according to claim 10,
wherein in each pixel, a number of first light-emitting layers is larger than a number of second light-emitting layers.

13. The display device according to claim 10,
wherein the light-blocking portion further includes a bank that partitions each of the first light-emitting layer and the second light-emitting layer and that protrudes upward beyond the light-emitting surface, and the first light-emitting layer has, compared to the second light-emitting layer, a larger depth from a top face of the bank to the light-emitting surface.

* * * * *